United States Patent [19]
Cabler

[11] Patent Number: 5,648,779
[45] Date of Patent: *Jul. 15, 1997

[54] SIGMA-DELTA MODULATOR HAVING REDUCED DELAY FROM INPUT TO OUTPUT

[75] Inventor: Carlin Dru Cabler, Austin, Tex.

[73] Assignee: Advanced Micro Devices, Inc., Austin, Tex.

[*] Notice: The term of this patent shall not extend beyond the expiration date of Pat. No. 5,442,354.

[21] Appl. No.: 352,665

[22] Filed: Dec. 9, 1994

[51] Int. Cl.$^6$ .................................................. H03M 3/02
[52] U.S. Cl. .......................... 341/143; 341/118; 375/254
[58] Field of Search ............................... 341/143, 118, 341/77; 375/254

[56] References Cited

U.S. PATENT DOCUMENTS

| | | | |
|---|---|---|---|
| 4,590,457 | 5/1986 | Amir | 340/347 |
| 4,704,600 | 11/1987 | Uchimura et al. | 340/347 |
| 4,849,662 | 7/1989 | Holberg et al. | 307/520 |
| 4,851,841 | 7/1989 | Sooch | 341/143 |
| 4,876,542 | 10/1989 | van Bavel et al. | 341/143 |
| 4,918,454 | 4/1990 | Early et al. | 341/172 |
| 4,920,544 | 4/1990 | Endo et al. | 375/26 |
| 4,939,516 | 7/1990 | Early | 341/143 |
| 5,039,989 | 8/1991 | Welland et al. | 341/143 |
| 5,055,843 | 10/1991 | Ferguson, Jr. et al. | 341/143 |
| 5,061,928 | 10/1991 | Karema | 341/143 |
| 5,065,157 | 11/1991 | Ribner et al. | 341/143 |
| 5,068,660 | 11/1991 | Swanson et al. | 341/143 |
| 5,068,661 | 11/1991 | Kaneaki et al. | 341/143 |
| 5,079,550 | 1/1992 | Sooch et al. | 341/143 |
| 5,084,702 | 1/1992 | Ribner | 341/143 |
| 5,103,229 | 4/1992 | Ribner | 341/143 |
| 5,148,166 | 9/1992 | Ribner | 341/143 |
| 5,148,167 | 9/1992 | Ribner | 341/143 |
| 5,153,593 | 10/1992 | Walden et al. | 341/143 |
| 5,157,395 | 10/1992 | Del Signore et al. | 341/143 |
| 5,162,799 | 11/1992 | Tanimoto | 341/143 |
| 5,184,130 | 2/1993 | Mangelsdorf | 341/156 |
| 5,189,419 | 2/1993 | Lyden | 341/143 |
| 5,198,817 | 3/1993 | Walden et al. | 341/143 |
| 5,208,597 | 5/1993 | Early et al. | 341/172 |
| 5,210,537 | 5/1993 | Mangelsdorf | 341/156 |
| 5,274,375 | 12/1993 | Thompson | 341/143 |
| 5,283,578 | 2/1994 | Ribner et al. | 341/143 |
| 5,298,900 | 3/1994 | Mauthe et al. | 341/143 |
| 5,311,181 | 5/1994 | Ferguson, Jr. et al. | 341/143 |
| 5,442,354 | 8/1995 | Cabler | 341/143 |

FOREIGN PATENT DOCUMENTS

| | | | |
|---|---|---|---|
| 0 104 988 | 4/1984 | European Pat. Off. | |
| 0328318A2 | 3/1989 | European Pat. Off. | H04B 14/04 |
| 0450947A2/A3 | 4/1991 | European Pat. Off. | H03M 3/02 |
| 0 586 021 A1 | 3/1994 | European Pat. Off. | H03M 7/32 |

OTHER PUBLICATIONS

Matsuya, et al., "A 16-Bit Oversampling A-to-D Conversion Technology Using Triple-Integration Noise Shaping," *IEEE Journal of Solid State Circuits*, vol. SC-22, No. 6, pp. 921–929, Dec. 1987.

(List continued on next page.)

*Primary Examiner*—Jeffrey A. Gaffin
*Assistant Examiner*—Jason L. W. Kost
*Attorney, Agent, or Firm*—Fulbright & Jaworski L.L.P.

[57] ABSTRACT

Described herein is a fourth-order sigma-delta modulator which utilizes two second-order sigma-delta modulators connected together. Each second-order sigma-delta modulator is characterized as including integrators having a ½ sample period delay from input to output. A second-order sigma-delta modulator, including such integrators, exhibits a single sample period delay from input to output. A fourth-order sigma-delta modulator, which includes two such second-order sigma-delta modulators, exhibits a delay of two sample periods from input to output. The present sigma-delta modulator can be fabricated using switched capacitor circuitry to form an A/D convertor, and in another embodiment can be used as a digital noise shaper for a D/C convertor circuit. The ½ unit delay is implemented without requiring two D-flip flops in series, which results in a design and manufacturing advantage.

11 Claims, 20 Drawing Sheets

OTHER PUBLICATIONS

Ribner, et al., "A Third-Order Multistate Sigma-Delta Modulator with Reduced Sensitivity to Nonidealities," *IEEE Journal of Solid-State Circuits*, vol. 26, No. 12, pp. 1764–1774, Dec. 1991.

Chao, et al., "A Higher Order Topology for Interpolative Modulators for Oversampling A/D Converters," *IEEE Transactions on Circuits and Systems*, vol. 37, No. 3, pp. 309–318, Mar. 1990.

"A Self-Calibrating 15 Bit CMOS A/D Converter," Hae-Seung Lee et al.; *IEEE Journal of Solid State Circuits*, vol. SC-19, No. 6, Dec. 1984.

"A 12-Bit Successive-Approximation-Type ADC with Digital Error Correction," Kanit Bacrania, *IEEE Journal of Solid-State Circuits*, vol. SC-21, No. 6, Dec. 1986.

"A Third-Order Cascaded Sigma-Delta Modulators," Louis A. Williams III et al., *IEEE Transactions on Circuits and Systems*, 38 (1991) May, No. 5, New York, pp. 489–497.

"Low-Distortion Switched-Capacitor Filter Design Techniques," Kuang-Lu Lee, et al., *IEEE Journal of Solid-State Circuits*, vol. SC-20, No. 6, Dec. 1985, pp. 1103–1113.

"The Implementation of Digital Echo Cancellation in Codecs," Vladimir Friedman, et al., *IEEE Journal of Solid-State Circuits*, vol. 25, No. 4, Aug. 1990, pp. 979–986.

"A 192ks/s Sigma-Delta ADC with Integrated Decimation Filters Providing –97.4dB THD," Mark A. Alexander, et al., *ISSCC94*/Session 11/Oversampled Data Coversion/Paper TP 11.3, *1994 IEEE International Solid-State Circuits Conference*.

"A Voiceband Codec with Digital Filtering," James C. Candy, et al., *IEEE Transactions on Communications*, vol. COM-29, No. 6, Jun. 1981, pp. 815–829.

"A Per-Channel A/D Converter Having 15-Segment µ-255 Companding," James C. Candy, et al., *IEEE Transactions on Communications*, vol. COM-24, Jan. 1976.

"Switched-Capacitor Second-Order Noise-Shaping Coder," G. Lainey, et al., *Electronics Letters*, 17th Feb. 1983, Vo. 19, No. 4, pp. 149–150.

"Multirate Filter Designs Using Comb Filters," Shuni Chu, et al., *IEEE Transactions on Circuits and Systems*, vol. CAS-31, No. 11, Nov. 1984, pp. 913–924.

"A 120dB Linear Switched-Capacitor Delta-Sigma Modulator," Donald A. Kerth, et al., *1994 IEEE International Solid-State Circuits Conference, Digest of Technical Papers*, TP 11.6, pp. 196–197, *ISSCC94*/Thursday, Feb. 17, 1994/Sea Cliff.

"A Stereo 97dB SNR Audio Sigma-Delta ADC," Tapani Ritoniemi, et al., *1994 IEEE International Solid-State Circuits Conference, ISSCC94*/Session 11/Oversampled Data Conversion/Paper TP 11.7, pp. 198–199.

"A Digitally-Corrected 20b Delta-Sigma Modulator," Charles D. Thompson, et al., *1994 IEEE International Solid-State Circuits Conference, ISSCC94*/Session 11/Oversampled Data Conversion/Paper TP 11.5, pp. 194–195.

"An Economical Class of Digital Filters for Decimation and Interpolation," Eugene B. Hogenauer., *IEEE Transactions on Acoustics, Speech, and Signal Processing*, vol. ASSP-29, No. 2, Apr. 1981, pp. 155–162.

"Decimation for Sigma Delta Modulation," James C. Candy, *IEEE Transactions on Communications*, vol. COM-34, No. 1, Jan. 1986, pp. 72–76.

"Multirate Digital Filters, Filter Banks, Polyphase Networks, and Applications: A Tutorial," P. P. Vaidyanathan, *Proceedings of the IEEE*, vol. 78, No. 1, Jan. 1990, pp. 56–93.

"A Multistage Delta-Sigma Modulator without Double Integration Loop," Toshio Hayashi, et al., *1986 IEEE International Solid-State Circuits Conference, ISSCC 86*/Thursday, Feb. 20, 1986/California Pavilion C, pp. 182–183.

"Circuit and Technology Considerations for MOS Delta-Sigma A/D Converters," Max W. Hauser et al., *1986 IEEE*, pp. 1310–1315.

"A 16b Oversampling A/D Conversion Technology using Triple Integration Noise Shaping," Yasuyuki Matsuya, et al., *1987 IEEE International Solid-State Circuits Conference, ISSCC 87*/Wednesday, Feb. 25, 1987/Trianon Ballroom, pp. 48–50.

"A 3-µm CMOS Digital Codec with Programmable Echo Cancellation and Gain Setting," Paul Defraeye, et al., *IEEE Journal of Solid-State Circuits*, vol. SC-20, No. 3, Jun. 1985, pp. 679–687.

"Fourth Order Sigma-Delta Modulator Circuit for Digital Audio and ISDN Applications," T. Karema, et al., Tampere University of Technology, Finland, pp. 223–227.

"Area-Efficient Multichannel Oversampled PCM Voice-Band Coder," Bosco H. Leung, et al., *IEEE Journal of Solid-State Circuits*, vol. 23, No. 6, Dec. 1988, pp. 1351–1357.

"Design and Implementation of Digital FIR Filters," P. P. Vaidyanathan, Chapter 2 in *Handbook of DSP Engineering Applications*, D. F. Elliott, editor, Academic Press, 1987.

"Reduction of Quantizing Noise by Use of Feedback," H. A. Spang, III, and P. M. Schultheiss, reprinted from *IRE Trans. Commun. Systems*, pp. 373–380, Dec. 1962.

"Design of Stable High Order 1-Bit Sigma-Delta Modulators," Tapani Ritoniemi, et al., Signal Processing Laboratory, Tampere University of Technology, reprinted from *IEEE Proc. ISCAS '90*, pp. 3267–3270, May 1990.

"A Monolithic 50 KHz 16-Bit A/D-D/A Converter Using Sigma-Delta Modulation," Charles D. Thompson, et al., Digital Signal Processor Operation/Motorola, Inc. 1990 *IEEE*.

"A Comparison of Modulator Networks for High-Order Oversampled ΣΔ Analog-to-Digital Converters," D. B. Ribner, *IEEE Transactions on Circuits and Systems*, (1991) Feb., No. 2, pp. 145–159.

Friedman, et al., "The Implementation of Digital Echo Cancellation in Codecs," *IEEE Journal of Solid-State Circuits*, vol. 25, No. 4, 1 Aug. 1990, pp. 979–986, XP 000149247.

Norsworthy, et al., "A 14-bit 80-kHz Sigma-Delta A/D Converter: Modeling, Design, and Performance Evaluation," *IEEE Journal of Solid-State Circuits*, vol. 24, No. 2, 1 Apr. 1989, pp. 256–266, XP 000122348.

SIGMA-DELTA MODULATOR HAVING REDUCED DELAY FROM INPUT TO OUTPUT

BACKGROUND OF THE INVENTION

1. Field of the Invention

This invention relates to high resolution analog-to-digital and digital-to-analog converters, and in particular, to oversampled, noise shaping analog-to-digital and digital-to-analog converters.

2. Brief Description of the Related Technology and Prior Art

The use of sigma-delta modulators in analog-to-digital (A/D) and digital-to-analog (D/A) converter circuits is increasing. It is well known in the art that so-called higher order sigma-delta modulators have an inherently higher signal-to-noise ratio than lower ordered sigma-delta modulators. For many practical applications, fourth-order sigma-delta modulators have become the higher-order modulator of choice because they strike an appropriate balance between analog circuit complexity and accompanying digital filtering complexity. Various fourth-order sigma-delta modulators for A/D circuits are described in the following applications assigned to the common assignee of the present invention: application Ser. No. 08/112,610, filed Aug. 26, 1993, entitled "Fourth-Order Cascaded Sigma-Delta Modulator;" application Ser. No. 08/147,062, filed Nov. 3, 1993, entitled "Fourth-Order Cascaded Sigma-Delta Modulator;" and application Ser. No. 08/171,091, filed Dec. 21, 1993, entitled "Fourth-Order Cascaded Sigma-Delta Modulator." Another fourth-order sigma-delta modulator is described by Karema, et al, in U.S. Pat. No. 5,061,928. The aforementioned applications describe sigma-delta modulators created by connecting two, second-order sigma-delta modulators, each such modulator being characterized as having two associated unit delays from input to output. In each of the above applications, a unique post-quantization network combines the output of the two, second-order sigma-delta modulators in a manner such that a single modulated multi-bit data stream, with fourth-order shaping, results. The modulators in all of the examples given above are characterized as having four unit delays from input to final output.

A need has developed for a fourth-order sigma-delta modulator with fewer than four unit delays from input to output in order to overcome disadvantages associated with those fourth-order modulators having four unit delays from input to output. Prior art fourth-order sigma-delta modulators implemented as A/D converters suffer from increased operational amplifier and post-quantization network complexity. Additionally, when such sigmadelta modulators are used in the feedback loop of such circuits as echo cancelers, stability may be difficult to obtain due to the amount of delay from input to output through the sigma-delta modulator.

The sigma-delta modulator of FIG. 1 is an example of a fourth-order sigma-delta modulator which is formed by connecting two, second-order sigma-delta modulators. This is similar to the fourth-order modulator described in U.S. Pat. No. 5,061,928 by Karema, et al. This modulator is characterized as a cascade of two second-order modulators. These second-order modulators are characterized as including two integrators each of which can be characterized as having the following transfer function:

$$H(z)=z^{-1}/(1-z^{-1})$$

As can be seen in the above equation, there is a single unit delay in such an integrator due to the $z^{-1}$ term in the numerator. Additionally, such second-order modulators are also characterized as having a quantizer, which typically is used to quantize only the sign of the signal presented at its input. This is commonly modeled as a summing node where one input is the input to the quantizer (Q) and the other input is a noise source (E) which represents the quantization noise of the quantizer. Such a model is shown in FIG. 1 as $Q_1$ and $Q_2$. The overall transfer function of such a second-order modulator is typically given by the following equation:

$$y(z)=z^{-2}x(z)+E(z)(1-z^{-1})^2$$

where y(z) is the output of the modulator, x(z) is the sampled input to the modulator, and E(z) is the quantization noise of the quantizer within the modulator.

When two such second-order modulators are connected together as shown in FIG. 1, the transfer function at output y1(z) can be characterized by the following equation:

$$y_1(z)=z^{-2}x(z)+E_1(z)(1-z^{-1})^2$$

where x(z) is the sampled input to the modulator and $E_1(z)$ is the quantization noise of quantizer $Q_1$. Output $y_2(z)$ can be characterized by the following equation:

$$y_2(z)=z^{-2}E_1(z)+KE_2(z)(1-z^{-1})^2$$

where $E_1(z)$ is the quantization noise due to quantizer $Q_1$, K is a constant that is frequently used as a scaling factor for the connection between the first and second modulator, and $E_2(z)$ is the quantization noise due to the quantizer $Q_1$.

The two modulator outputs, $y_1(z)$ and $y_2(z)$ are typically combined using a post-quantization network which results in a final modulator output $y_{out}(z)$. An appropriate post-quantization network for use with the circuit of FIG. 1 is shown in FIG. 2. Such a circuit along with the two, second-order sigma-delta modulators shown in FIG. 1 will result in an overall fourth-order sigma-delta modulator which may be characterized by the following equation:

$$y_{out}(z)=z^{-4}x(z)+KE_2(z)(1-z^{-1})^4$$

Essentially, the post-quantization circuit of FIG. 2 removes the quantization noise $E_1(z)$ due to quantizer $Q_1$. It also results in an overall fourth-order high pass filtering function on the quantization noise $E_2(z)$ due to quantizer $Q_2$. As can be seen in the above equation, such a modulator has an overall constant group delay of four sample periods due to the $z^{-4}$ term in front of the x(z) term.

In application Ser. No. 08/147,062, described previously, a fourth-order sigma-delta modulator is formed by connecting two, second-order sigma-delta modulators together such that only the input of the first quantizer is fed to the second, second-order sigma-delta modulator. The output of each quantizer for each second-order sigma-delta modulator is then fed to a post-quantization network which removes the quantization noise of the first, second-order sigma-delta modulator and shapes the quantization noise of the second, second-order sigma-delta modulator with a fourth-order high pass filter function. Such a sigma delta modulator is shown in FIGS. 3 and 4 and can be characterized by the same equation that characterizes the operation of the fourth-order sigma-delta modulator described by Karema, et al. That is, the output of the fourth-order sigma-delta modulator described in the aforementioned application also has a constant group delay of four sample periods.

It is an object of the present invention to provide a fourth-order sigma-delta modulator which has high resolution, but with an overall constant group delay of two sample periods. This is to be accomplished by connecting together two, second-order sigma-delta modulators, each being characterized as having an overall constant group delay of one sample period. An example of a prior art second-order modulator having unit delays less than one is described in the *IEEE Journal of Solid State Circuits*, Vol. 25, no. 4, Aug. 1990, pp. 979–986, in the article entitled "The Implementation of Digital Echo Cancellation in Codecs," by Friedman, et al. Friedman describes a second-order modulator characterized as having integrators with ½ unit delays from input to output. Furthermore, the second-order sigma-delta modulator of Friedman is characterized as requiring two flip-flops to perform delay functions in the feedback of the modulator to obtain the desired transfer function. Such a second-order sigma-delta modulator is shown in FIG. 5.

It is, therefore, a further object of the present invention to describe a second-order sigma-delta modulator which does not require two flip-flops in the feedback of the sigma-delta modulator, thus reducing the manufacturing cost of such a sigma-delta modulator.

It is a further object of the present invention to utilize two such second-order sigma-delta modulators, which are to be connected together, to form a portion of a fourth-order sigma-delta modulator.

It is still a further object of the present invention to connect two such second-order modulators to a post-quantization network to form an overall fourth-order sigma-delta modulator with a total of two unit sample delays.

It is yet another object of the present invention to provide a sigmadelta modulator which can be fabricated using switched capacitor circuitry in such a fashion as to form an A/D converter.

It is still another object of the present invention to provide a sigmadelta modulator which can be used as a digital noise shaper for a D/A converter.

SUMMARY OF THE INVENTION

The fourth-order sigma-delta modulator of the present invention utilizes two, second-order sigma-delta modulators connected together. Each second-order sigma-delta modulator is characterized as including integrators with a ½ sample period delay from input to output. A second-order sigma-delta modulator including such integrators exhibits a single sample period delay from input to output. A fourth-order sigma-delta modulator which includes two such second-order sigma-delta modulators exhibits a delay of two sample periods from input to output.

In a preferred embodiment, a fourth-order analog-to-digital converter circuit is described by combining two such second-order sigma-delta modulators which include the characteristic that all capacitors which are connected to the output of each op amp within the sigma-delta modulator would be charged on the same clock phase. Because of this characteristic, glitches between clock phases are avoided and performance of the analog-todigital converter is improved.

In another embodiment, the two second-order sigma-delta modulators, and a portion of the post-quantization network, are constructed as a digital circuit that can be used as a digital noise shaper for a D/A converter. The resultant outputs of the post-quantization network may then be input into a plurality of D/A converters whose outputs are summed to form a single analog output.

DETAILED DESCRIPTION OF THE PREFERRED EMBODIMENT

Figure 1:
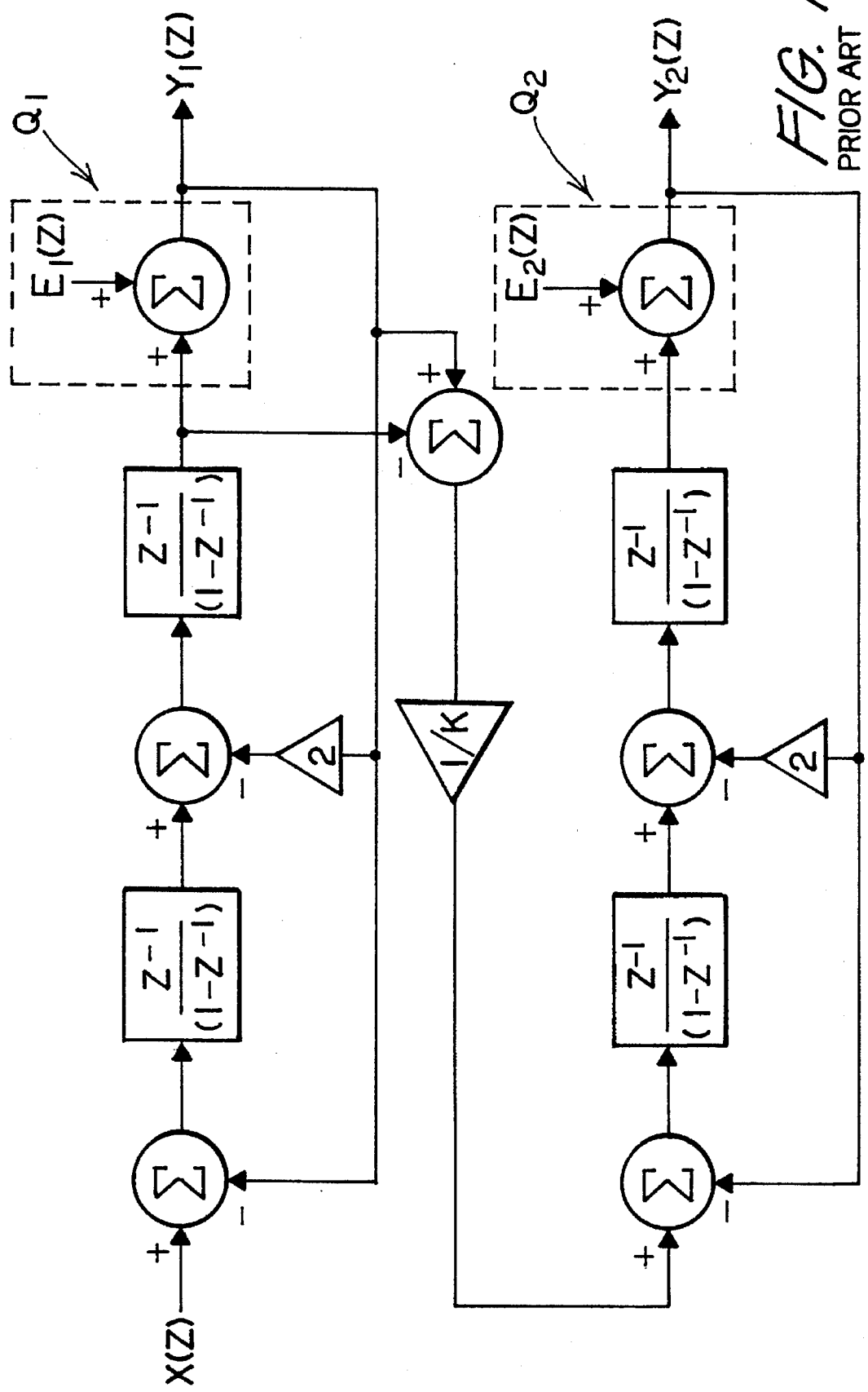
FIG. 1 is a block diagram of a fourth-order sigma-delta modulator of the prior art.
Figure 2:
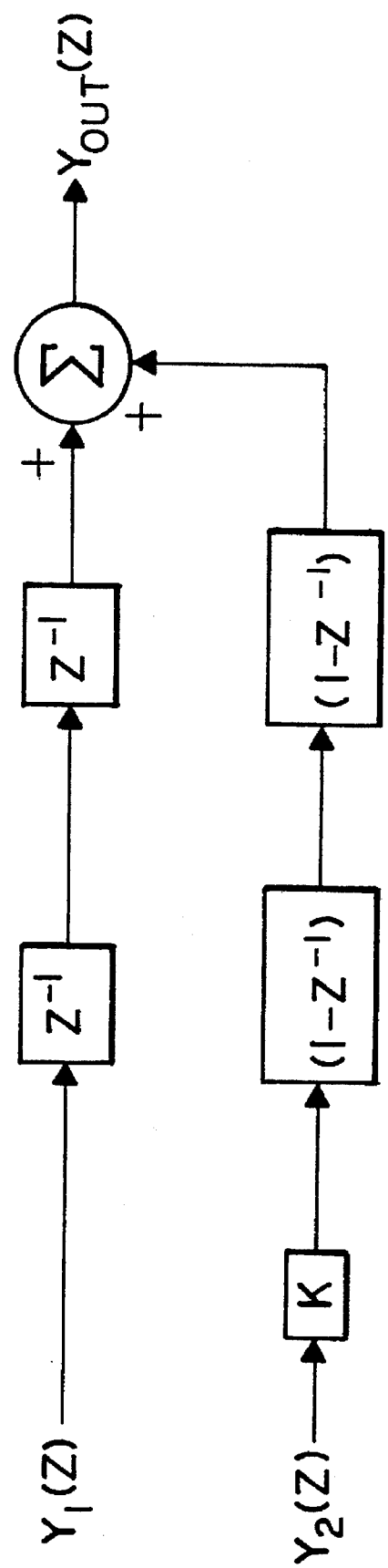
FIG. 2 is a block diagram of a post-quantization circuit of the prior art.
Figure 3:
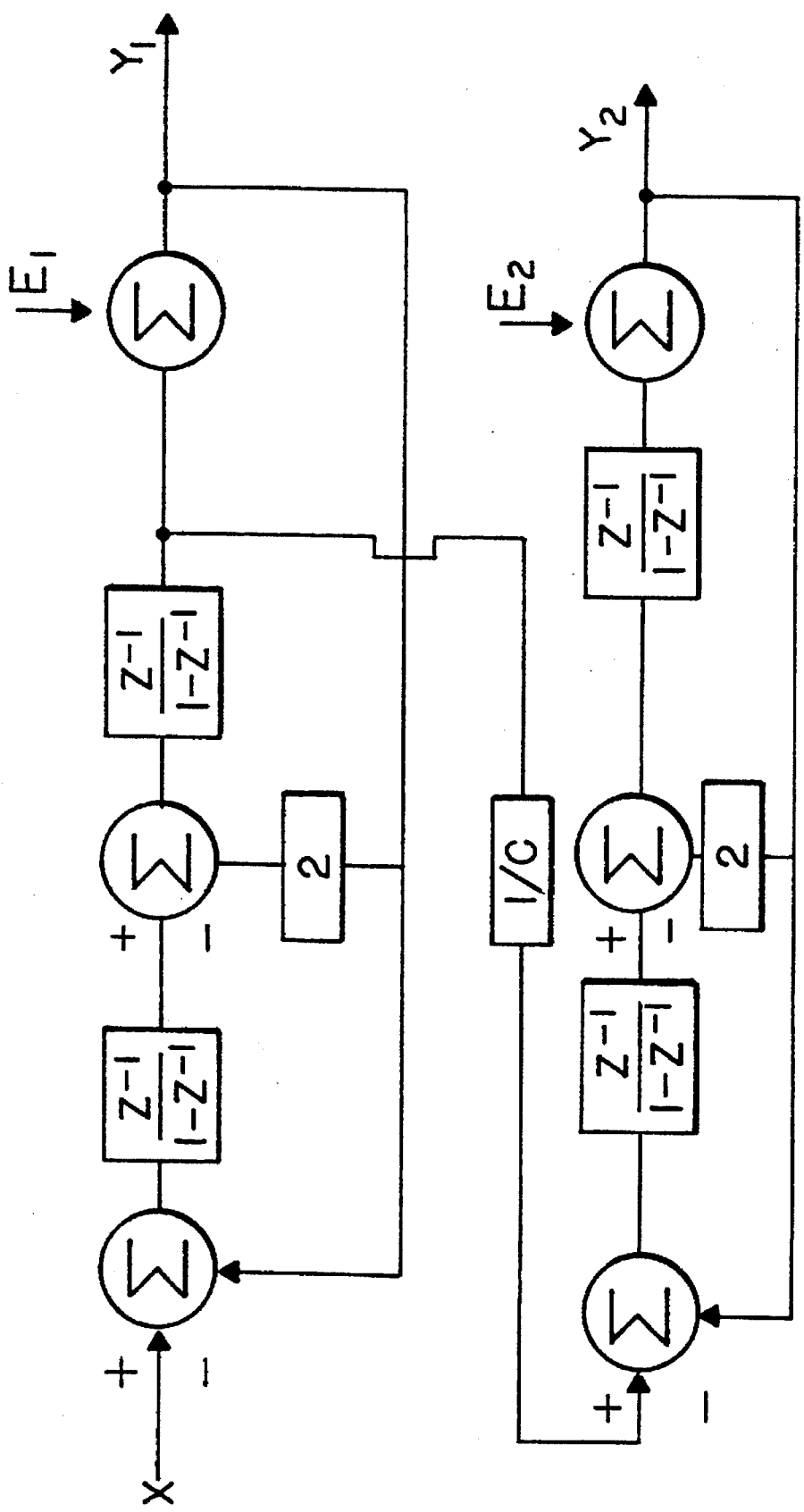
FIG. 3 is a block diagram of a fourth-order sigma-delta system of the prior art.
Figure 4:
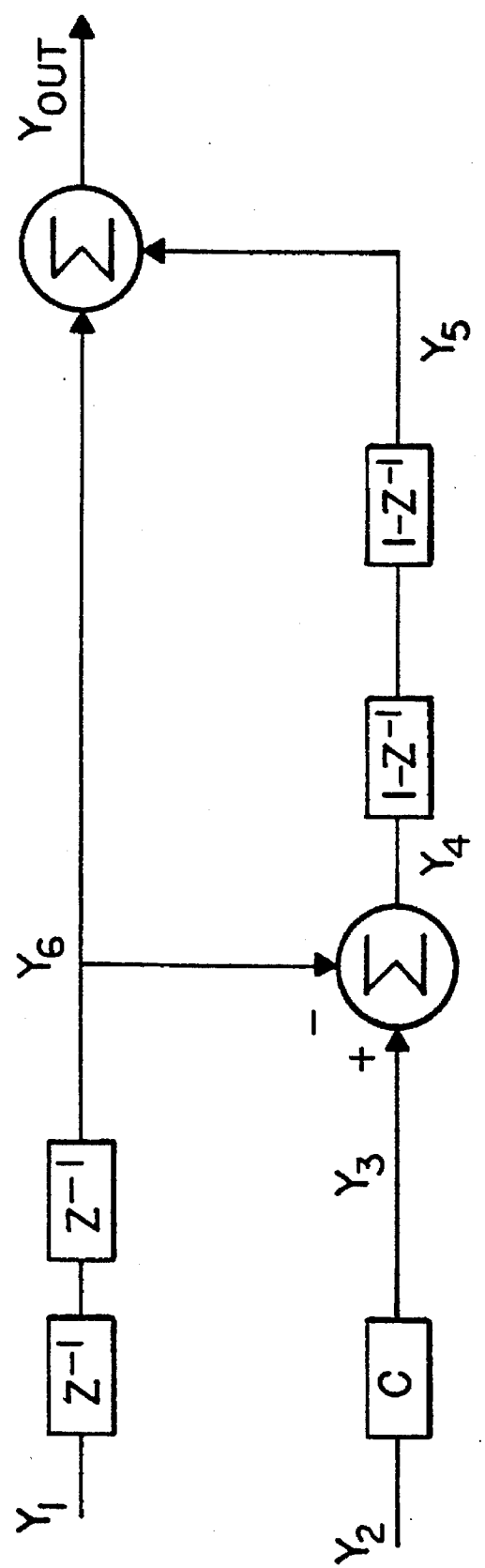
FIG. 4 is a block diagram of a post-quantization circuit of the prior art.
Figure 5:
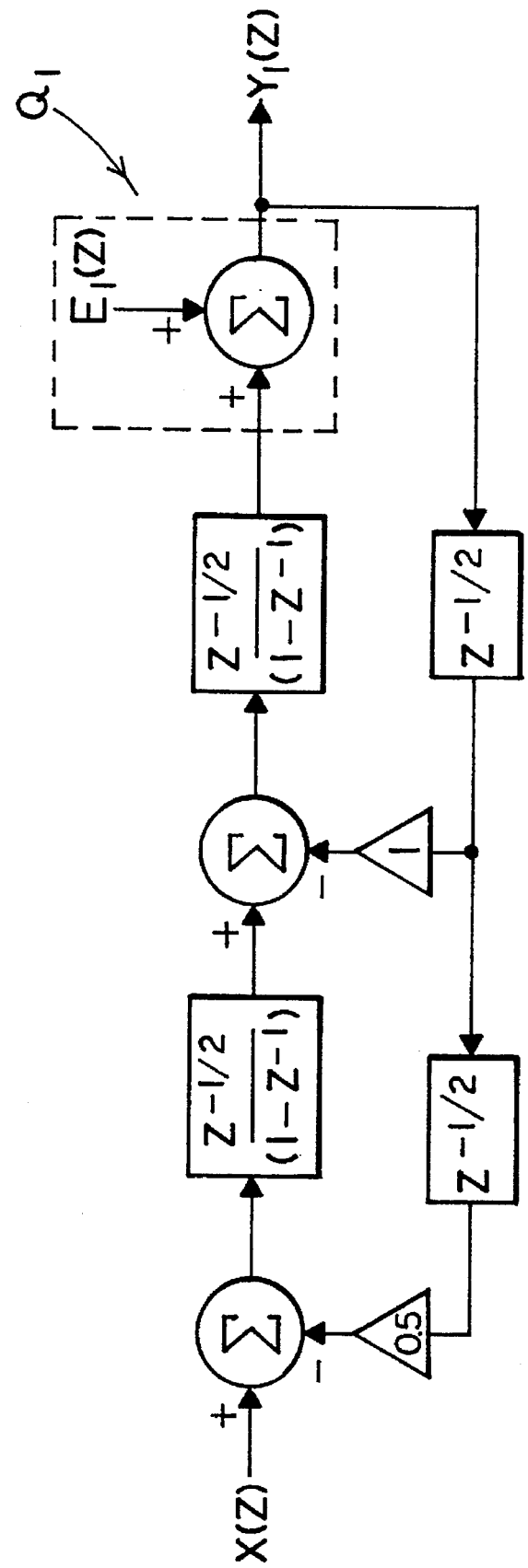
FIG. 5 is a block diagram of a second-order sigma-delta modulator of the prior art.
Figure 6:
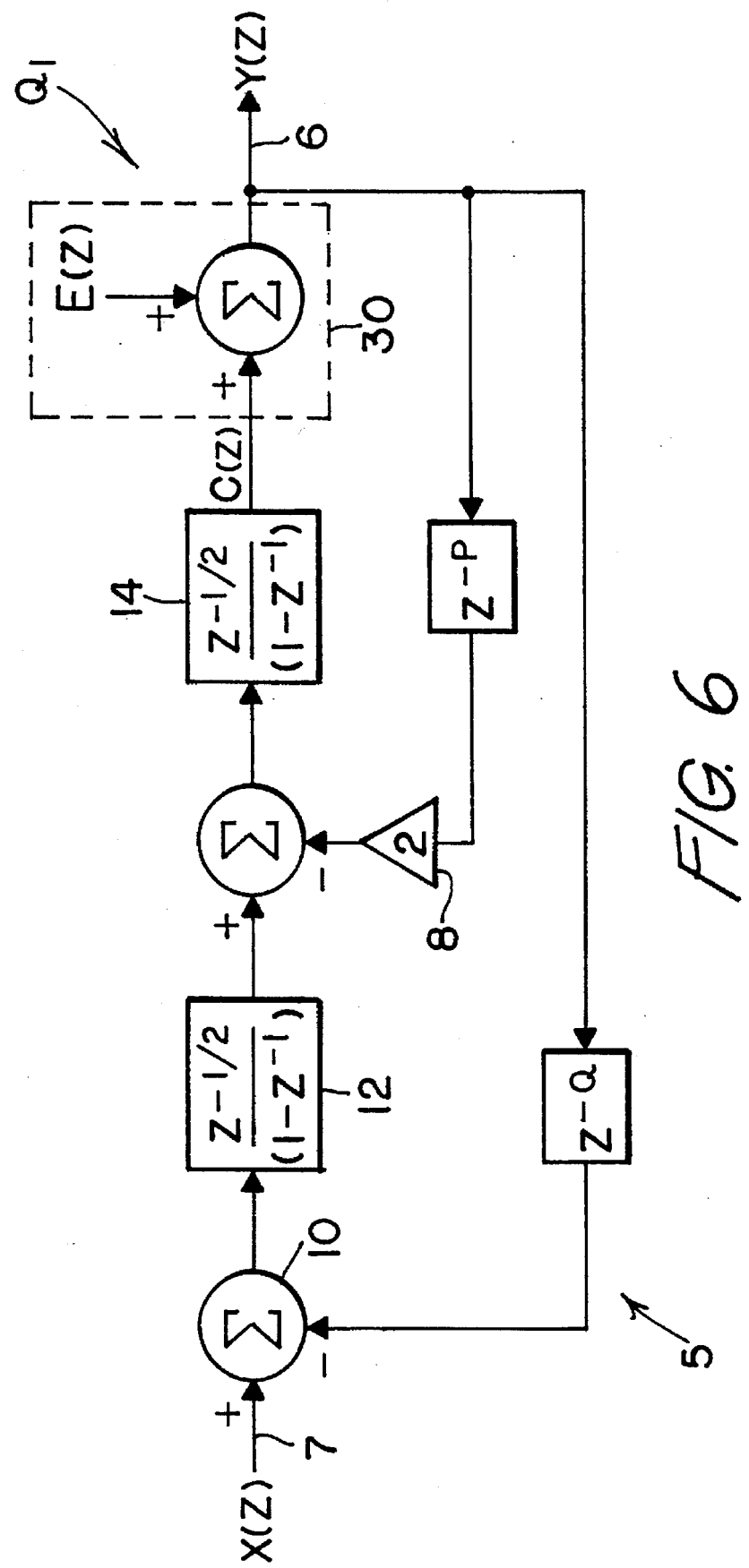
FIG. 6 is a block diagram of a second-order sigma-delta modulator of the present invention.

FIG. 6 is a functional block diagram of a second-order sigma-delta modulator 5 of the present invention. Integrators 12 and 14, each having a ½ unit delay with the following transfer function, are utilized:

$$H_1(z) = z^{-\frac{1}{2}}/(1-z^{-1})$$

A more common form of integrator is characterized by the following transfer function:

$$H_2(z) = z^{-1}/(1-z^{-1})$$

Figure 7:
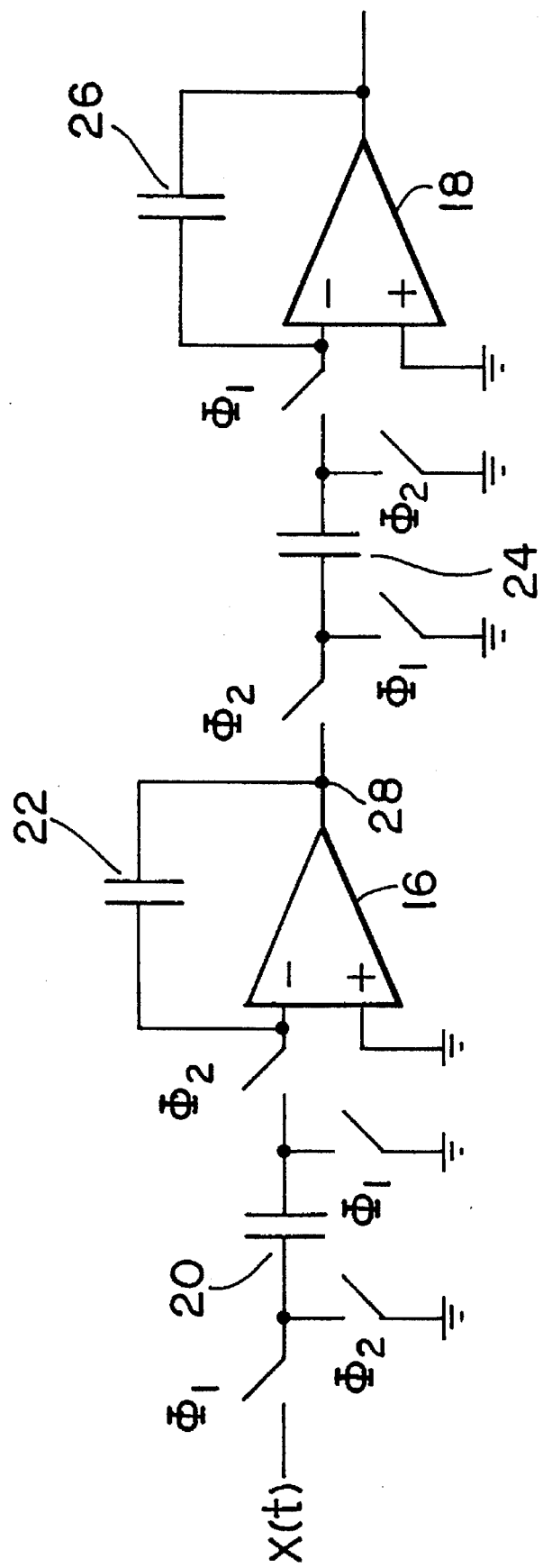
FIG. 7 is an embodiment of two integrators, each having one-half unit delay.
Figure 8:
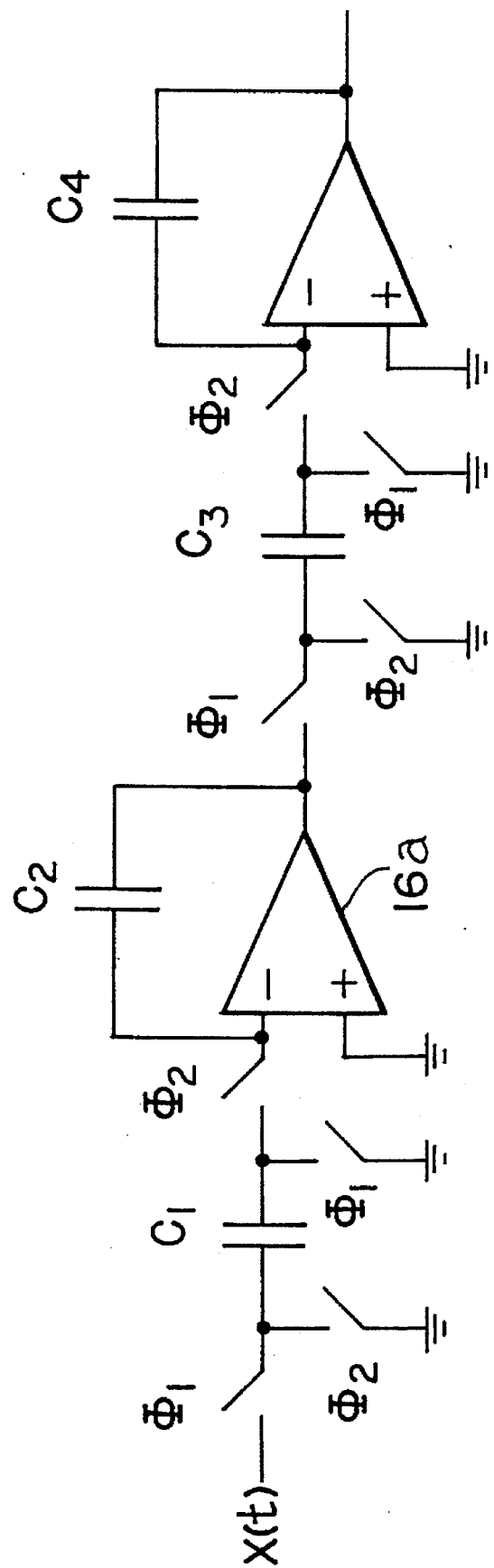
FIG. 8 is an embodiment of two integrators, each having one unit delay.
Figure 9:
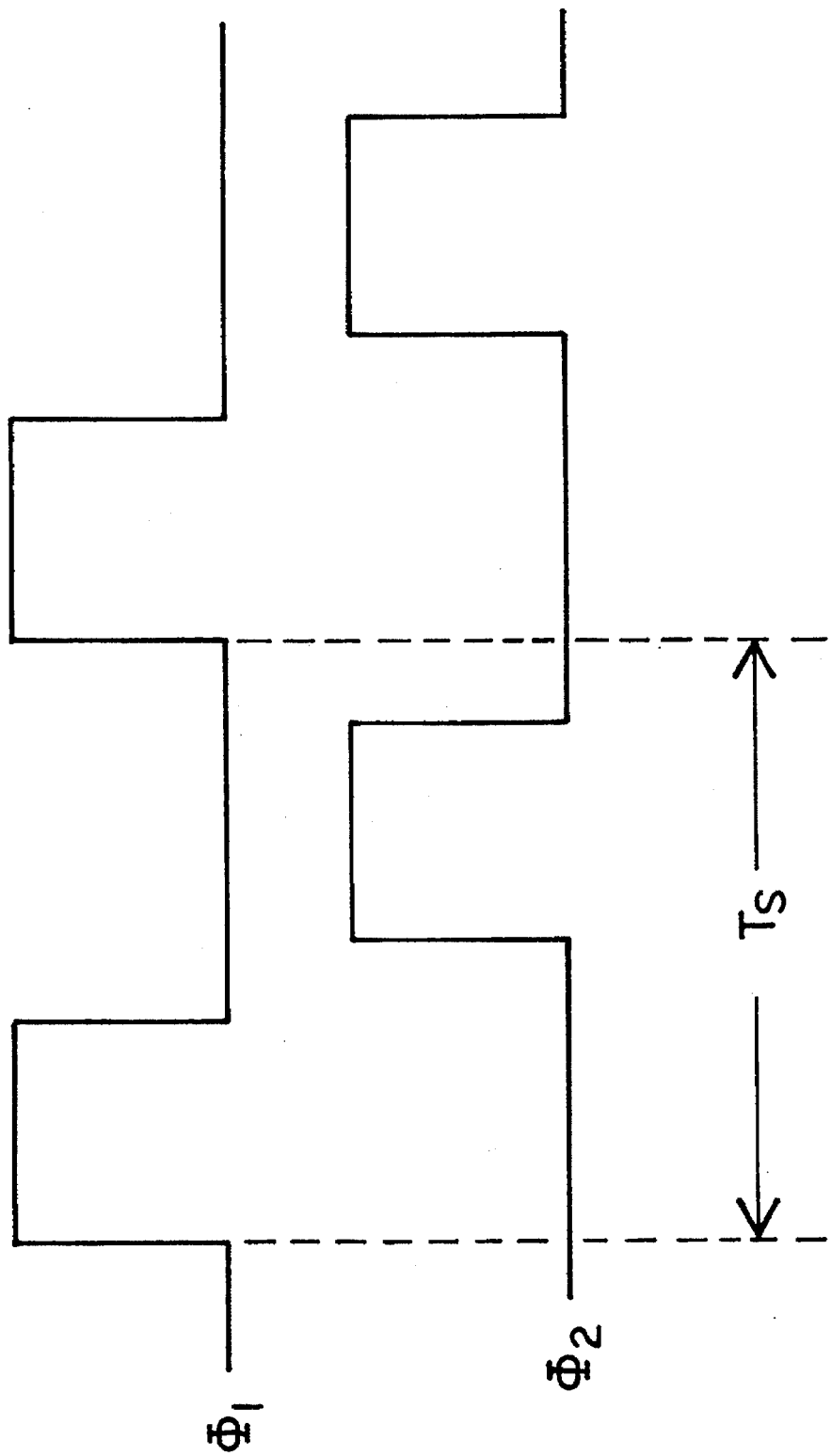
FIG. 9 is a timing diagram of the timing signals, $\Phi_1$ and $\Phi_2$, used with the switching capacitors of the present invention.

FIG. 7 schematically depicts a single-ended implementation of two integrators in series with half unit delays in each integrator. FIG. 8 is a single-ended implementation of two integrators in series with unit delays in each integrator. In FIGS. 7 and 8, $\Phi_1$ and $\Phi_2$ are two-phase non-overlapping clocks and are characterized such that neither clock is at a logic '1' during the same instant in time. An example of such clocks is shown in FIG. 9. When $\Phi_1$ is at a logic '1' any switch which is denoted as being controlled by $\Phi_1$ is closed. Such a switch is open at all other times. Likewise, when $\Phi_2$ is at a logic '1' any switch is denoted as being controlled by $\Phi_2$ is closed. Such a switch is open at all other times.

In FIG. 8, charge is added to capacitor $C_2$ while $\Phi_2$ is at a logic '1'. Once $\Phi_2$ becomes a logic '0' and $\Phi_1$ becomes a logic '1', the op amp 16a must charge capacitor $C_3$ from 0 volts to the voltage that the output of op amp 16a had achieved during the time $\Phi_2$ was a logic '1'. Since practical implementations of op amps have a finite output impedance, gain, and bandwidth, the output of op amp 16a will glitch at the beginning of the time during which $\Phi_1$ is a logic '1'. This is undesirable and may lead to reduced performance if such a structure is used in a sigma-delta modulator which performs an analog-to-digital conversion.

In FIG. 7, capacitor 24 and capacitor 22 are charging on the same clock phase. Because of this, op amp output node 28 does not glitch between clock phases. Such a structure may have the added benefit of increased performance when used in a sigma-delta modulator which is configured as an A/D converter circuit.

For reasons previously stated, it is desirable to have a second-order sigma-delta modulator circuit with only one unit delay. Such a modulator, as shown in FIG. 6, would have the desired transfer function given by the following equation:

$$y(z)=z^{-1}x(z)+E(z)(1-z^{-1})^2 \quad \text{Equation A}$$

In Equation A, E(z) represents the quantization noise of a quantizer $Q_1$ modelled as a summing node 30 in FIG. 6, where y(z) represents the output signal 6 of modulator 5 and x(z) represents a sampled analog input signal 7.

Referring to FIG. 6, y(z) can be represented by the following equation $$y(z)=E(z)+C(z) \quad \text{Equation 1}$$

Solving the block diagram given in FIG. 6 for C(z) yields the following equation:

$$C(z)=\{z^{-1}x(z)-y(z)[z^{-(Q+1)}+2z^{-(P+1/2)}-2z^{-(P+3/2)}]\}/(1-z^{-1})^2 \quad \text{Equation 2}$$

Now, after substituting C(z) in Equation 2 into Equation 1 and solving algebraically, the following equation results:

$$y(z)(1-z^{-1})^2=E(1-z^{-1})^2+z^{-1}x(z)-y(z)[z^{-(Q+1)}+2z^{-(P+1/2)}-2z^{-(P+3/2)}]$$

The above equation can be algebraically rearranged into the following equation:

$$y(z)[1-2z^{-1}+z^{-2}+z^{-(Q+1)}+2z^{-(P+1/2)}-2z^{-(P+3/2)}]=z^{-1}x(z)+E(z)(1-z^{-1})^2$$

The right hand side of the equation above is identical to the right hand side of Equation A, supra. Algebraically, this is true only if the following identity is true:

$$1-2z^{-1}+z^{-2}+z^{-(Q+1)}+2z^{-(P+1/2)}-2z^{-(P+3/2)}=1$$

Rearranging the above equation yields:

$$-2z^{-1}+z^{-2}+z^{-(Q+1)}+2z^{-(P+1/2)}-2z^{-(P+3/2)}=0$$

With Q=1 and P=½, the above equation is correctly resolved. Thus, the desired equation, $y(z)=z^{-1}x(z)+E(z)(1-z^{-1})^2$, is the transfer function for the block diagram shown in FIG. 6 when Q=1 and P=½. In other words, in order to satisfy the desired transfer function, there would be a delay of ½ of a sample period from the output of the quantizer $Q_1$ to the input of the gain of 2 block 8. Also, there would be a full sample period delay from the output of the quantizer $Q_1$ to the input of summing node 10.

Figure 10:
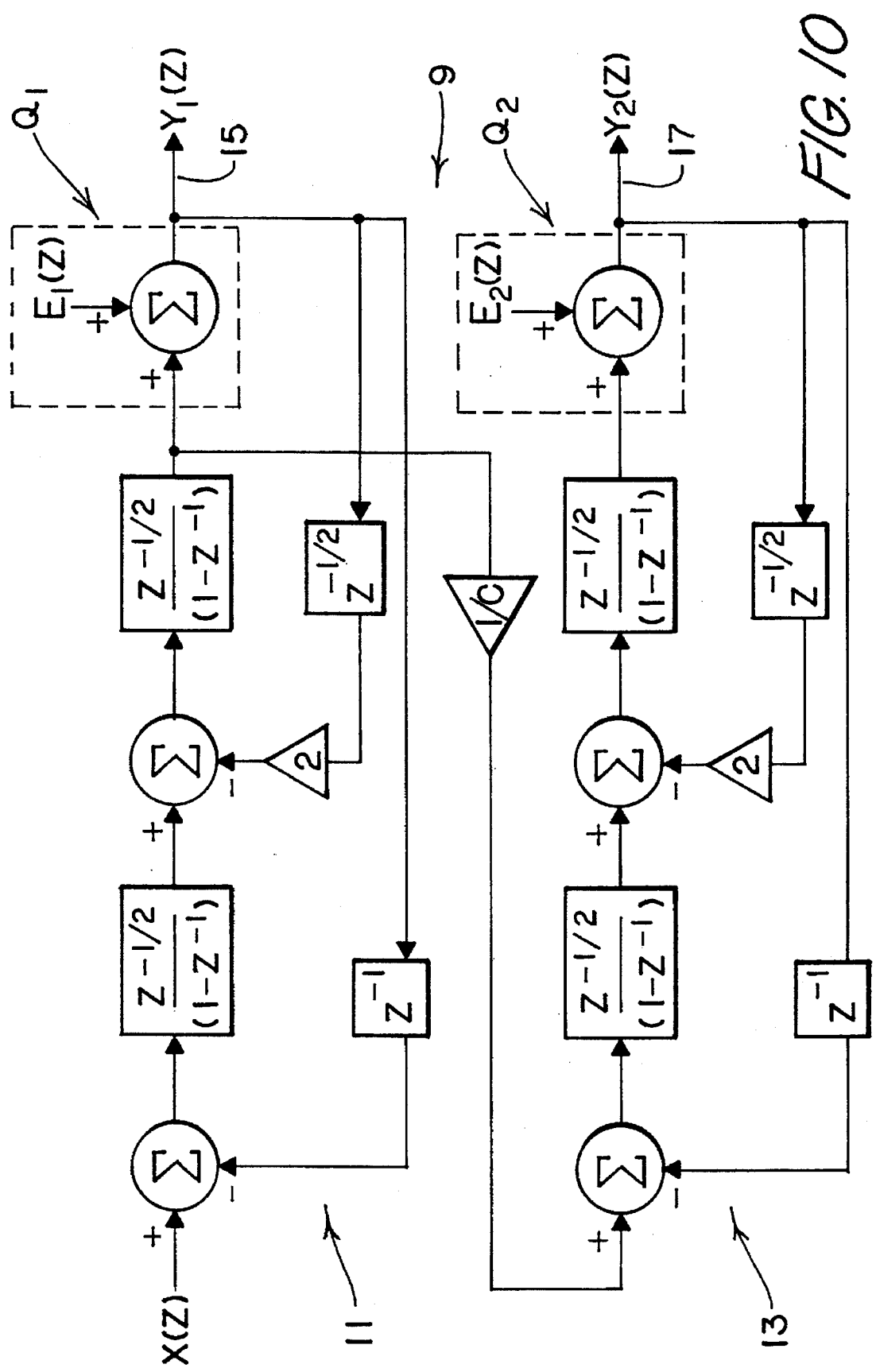
FIG. 10 is a block diagram of a fourth-order sigma-delta modulator of the present invention.

FIG. 10 illustrates the functional block diagram implementation of the current invention illustrated by a fourth-order sigma-delta modulator 9 formed by connecting together two, second-order sigma-delta modulators 11 and 13, each including ½ unit delay integrators associated therewith. The output signal 15, $y_1(z)$, in FIG. 10 is represented by the following equation:

$$y_1(z)=z^{-1}x(z)+E_1(z)(1-z^{-1})^2$$

The equation for output signal 17, $y_2(z)$, can be represented by the following equation:

$$y_2(z)=(1/C)z^{-1}y_1(z)-(1/C)z^{-1}E_1(z)$$

The term $E_1(z)$ is removed in equations for $y_1(z)$ and $y_2(z)$ so the following desired fourth-order output equation of the fourth-order modulator, as shown in FIG. 10, is achieved.

$$y_{out}(z)=z^{-2}x(z)+CE_2(z)(1-z^{-1})^4$$

To accomplish this, the following steps occur: Firstly, the $y_2(z)$ equation is multiplied by C, C representing a constant, which yields $y_3(z)$ as follows:

$$y_3(z)=z^{-1}y1(z)-z^{-1}E_1(z)+CE_2(z)(1-z^{-1})^2$$

Secondly, the term $z^{-1}y_1(z)$ is subtracted from $y_3(z)$ yielding the equation $y_4(z)$ as follows:

$$y_4(z)=-z^{-1}E_1(z)+CE_2(z)(1-z^{-1})^2$$

Next, $y_4(z)$ is multiplied by the term $(1-z^{-1})^2$ yielding the equation $y_5(z)$ as follows:

$$y_5(z)=-z^{-1}(1-z^{-1})^2E_1(z)+C(1-z^{-1})^4E_2(z)$$

Equation $y_1(z)$ is then multiplied by the term $z^{-1}$ which yields equation $y_6$, as follows:

$$y_6(z)=z^{-2}x(z)+z^{-1}E_1(z)(1-z^{-1})^2$$

Finally, equation $y_5(z)$ is added to equation $y_6(z)$ yielding the desired equation for $y_{out}(z)$, as follows:

$$y_{out}(z)=z^{-2}x(z)+CE_2(z)(1-z^{-1})^4$$

Figure 11:
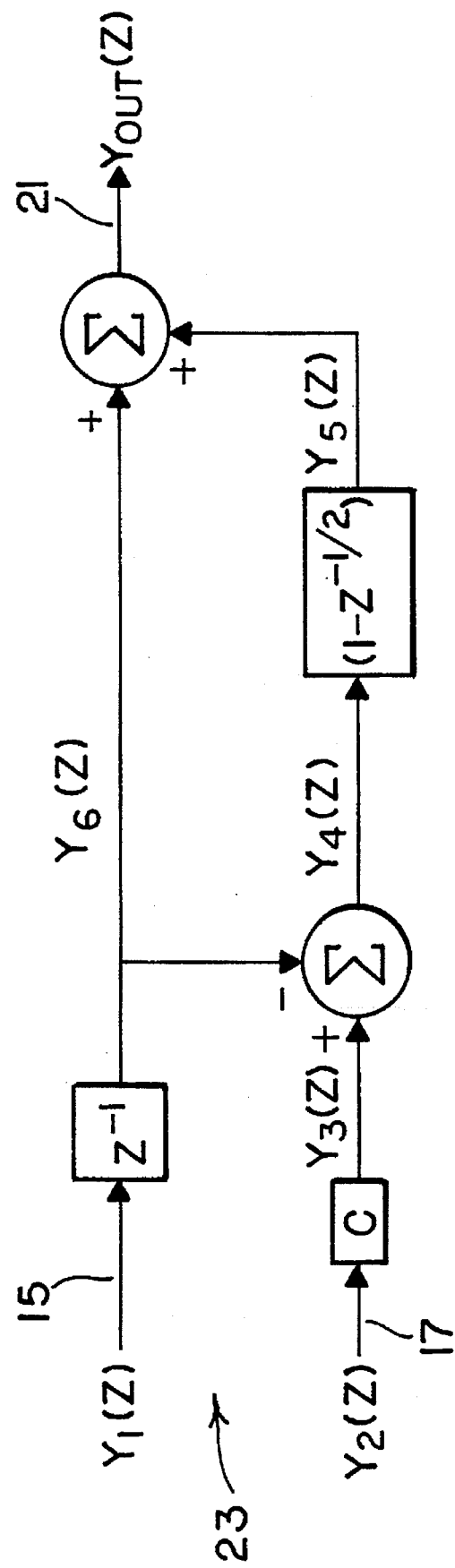
FIG. 11 is a block diagram of a post-quantization network of the present invention.

FIG. 11 illustrates the post-quantization network 23 which corresponds to the aforementioned equations that results in the above equation for $y_{out}(z)$, 21. Output signals 15 and 17, $y_1(z)$ and $y_2(z)$ from FIG. 10 are connected to $y_1(z)$ and $y_2(z)$, respectively, in FIG. 11.

Thus, in an A/D converter application, the output signal 21, $y_{out}(z)$, in FIG. 11 is available as an input signal to additional circuitry, such as a decimator filter.

Figure 12:
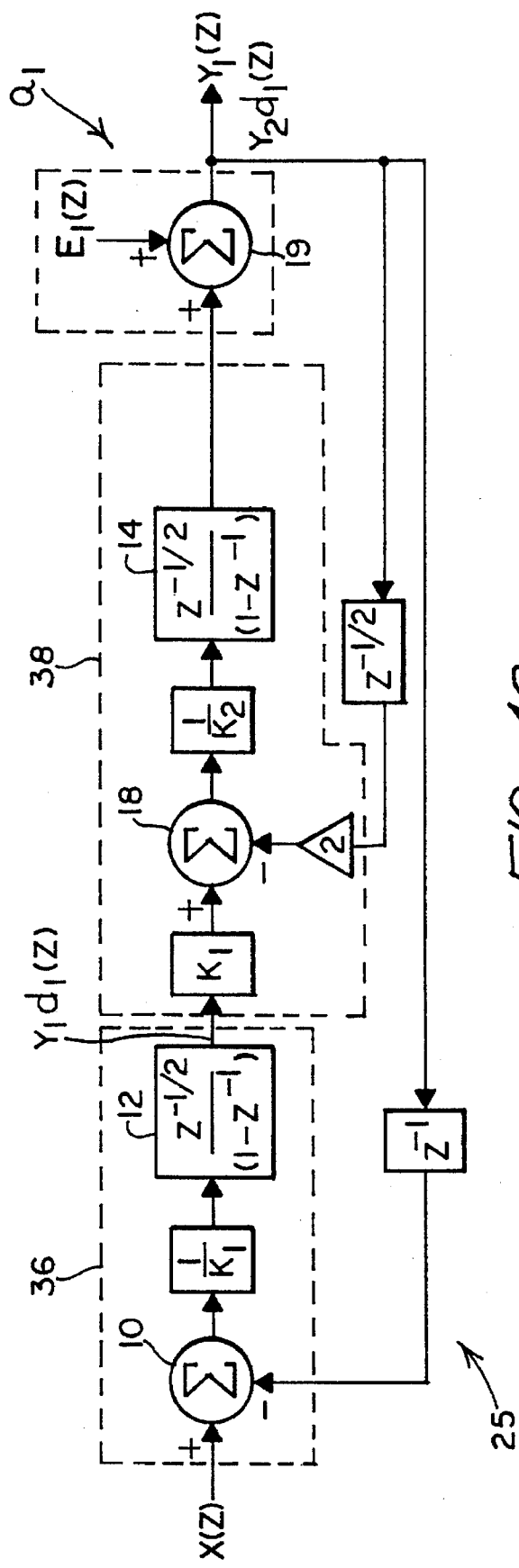
FIG. 12 is a block diagram of a second-order sigma-delta modulator of the present invention.

FIG. 12 illustrates how scaling is employed in the design of the second-order modulator 25 to prevent the integrators 36 and 38 from clipping, while not affecting the transfer function of the second-order sigma-delta modulator 25. The scaling is accomplished by using constants $K_1$ and $K_2$. Thus, the integrator in FIG. 12, is shown within the dashed area 36, which includes summing node 10, ½ unit delay integrator block 12 and a scaling factor $1/K_1$. Likewise, the other integrator in FIG. 12, shown within the dashed area 38, includes summing node 18, ½ unit delay integrator block 14, and constants $K_1$, $1/K_2$ and 2. Since $1/K_1$ in integrator 36 is compensated by factor $K_1$ in integrator 38, no net change occurs in the transfer function due to scaling factor $1/K_1$. The quantizer $Q_1$, denoted by summing node 19, with noise $E_1(z)$ as an input, is typically a comparator which quantizes only the sign of the signal input to it. Thus, the term $1/K_2$ can be of arbitrary size and will not affect the transfer function of the second-order sigma-delta modulator 25.

Figure 13:
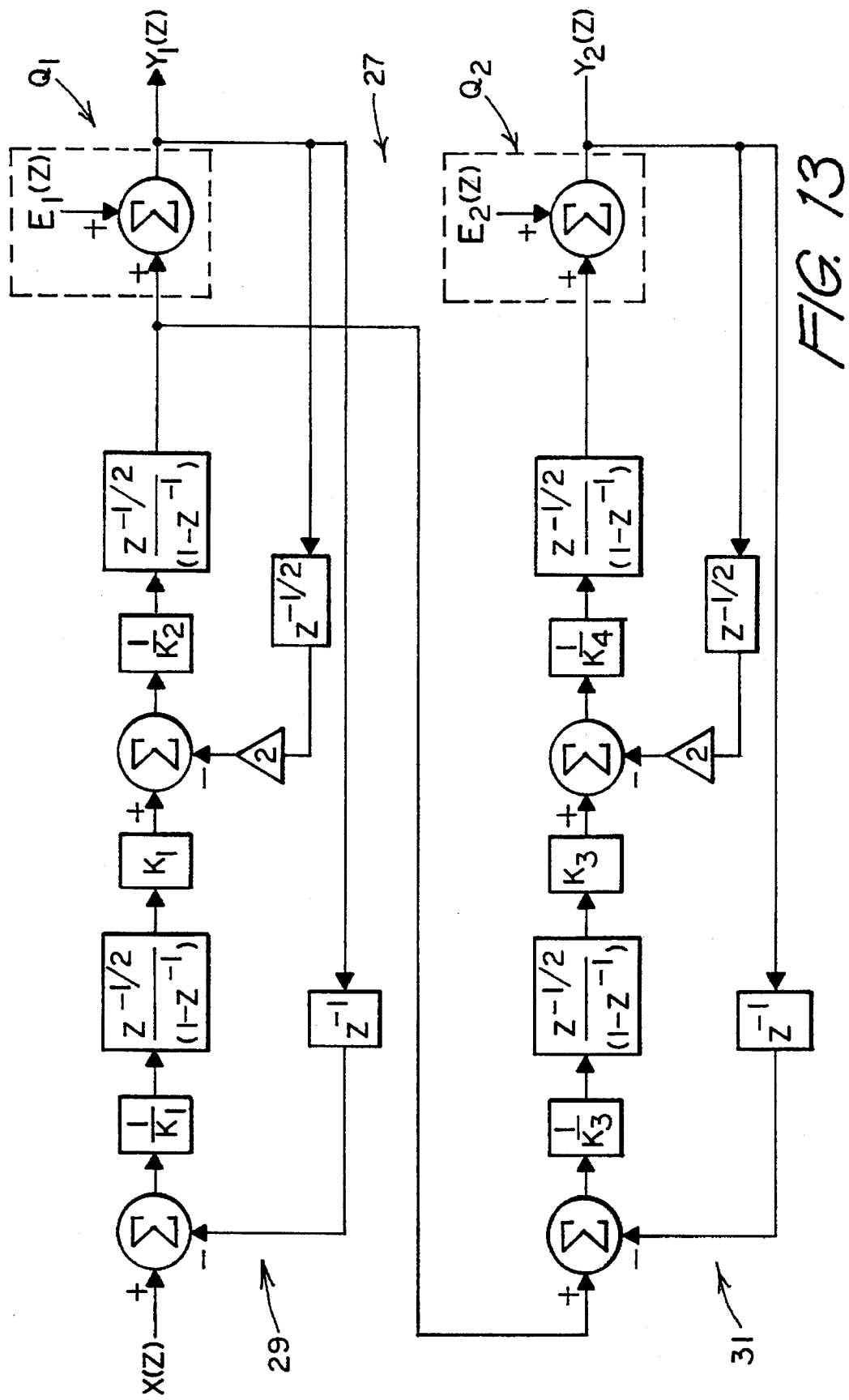
FIG. 13 is a block diagram of a fourth-order sigma-delta modulator of the present invention.

When two second-order sigma delta modulator sections 29 and 31, as shown in FIG. 13, are connected together to form a fourth-order modulator, the term $1/K_2$ acts as the 1/C scaling factor shown in FIG. 10. The resulting fourth-order modulator 27 is shown in FIG. 13. The post-quantization network which combines outputs $y_1(z)$ and $y_2(z)$ for sigma-delta modulator 27 shown in FIG. 13 is identical to the post-quantization correction network 23 shown in FIG. 11, with the constant C in FIG. 11 being replaced by the constant $K_2$.

Figure 14:
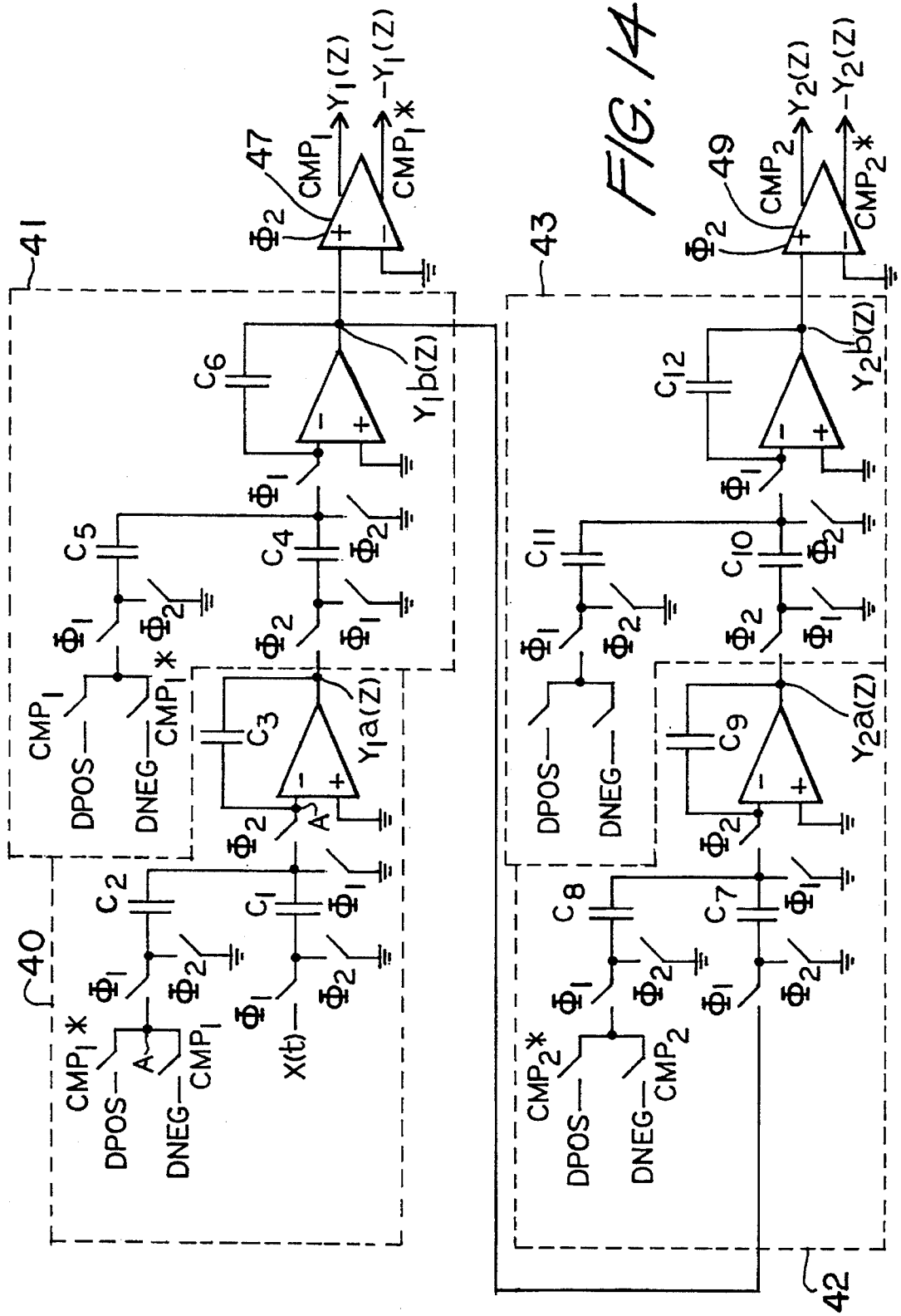
FIG. 14 is an embodiment of a fourth-order sigma-delta modulator of the present invention, which utilizes summing integrators.

FIG. 14 depicts an embodiment of the analog portion of the fourth-order sigma-delta A/D converter of the present invention. The implementation shown is a single ended configuration. If output signal $CMP_1$ is a logic '1' and output signal $CMP_1^*$ is a logic '0', then negative reference voltage DNEG is selected as an input to the summing integrator 40 and positive reference voltage DPOS is selected as an input to the summing integrator 41. If output signal $CMP_1$ is a logic '0' and output signal $CMP_1^*$ is a logic '1' then reference voltage DPOS is selected as an input to the summing integrator 40 and reference voltage DNEG is selected as an input to the summing integrator 41.

If output signal $CMP_2$ is a logic '1' and output signal $CMP_2^*$ is a logic '0' then reference voltage DNEG is selected as an input to the summing integrator 42 and reference voltage DPOS is selected as an input to the summing integrator 43. Likewise if $CMP_2$ is a logic '0' and $CMP_2^*$ is a logic '1' then reference voltage DPOS is selected as an input to the summing integrator 42 and reference voltage DNEG is selected as an input to the summing integrator 43.

Figure 15:
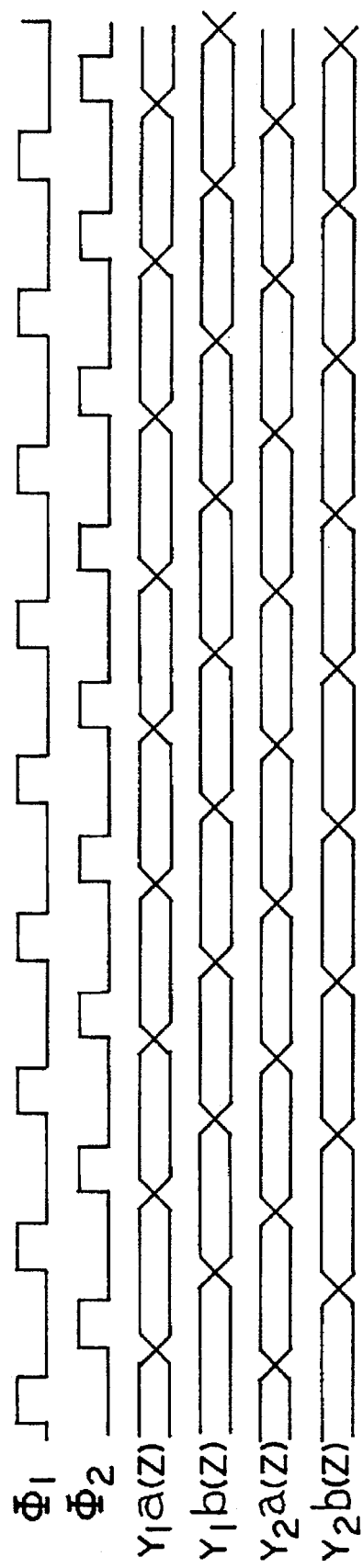
FIG. 15 is a timing diagram showing the relationship between the switch capacitor timing signals, $\Phi_1$ and $\Phi_2$, and the outputs y1a(z), y1b(z), y2a(z), and y2b(z), and of FIG. 14 of the present invention.

FIG. 15 is a timing diagram illustrating the timing relationships between the following signals which are shown in FIG. 14: $\Phi_1$, $\Phi_2$, the output $y_1a(z)$ of integrator 40, the output $y_1b(z)$ of integrator 41, the output $y_2a(z)$ of integrator 42, and the output $y_2b(z)$ of integrator 43.

The transfer function of summing integrator 40 in FIG. 14 can be represented by the following equation:

$$y_1a(z)=[(C_1/C_3)x(z)-z^{-1}(C_2/C_3)y_1(z)]z^{-\frac{1}{2}}/(1-z^{-1})$$

Since the output of $y_1(z)$ is sampled on $\Phi_2$, there is a ½ sample period delay in the feed-forward path of the integrator which is represented by the $z^{-\frac{1}{2}}$ term in the above equation. The logic value of $CMP_1$ and $CMP_1^*$ determine whether DPOS or DNEG is connected to the input A of integrator 40 in FIG. 14. Since $CMP_1$ (which corresponds to $y_1(z)$) connects reference voltage DNEG to the input A of integrator 40, an inherent negation is performed on $y_1(z)$ as it is fed into input A of integrator 40. Thus the summing integrator 40 acts to effectively calculate the scaled difference between the input signal $y_1(z)$ and the output signal $y_1(z)$. Also, since the actual value of $y_1(z)$, which is used in the subtraction process and whose output is sampled during the $\Phi_2$ clock phase is actually the output $y_1(z)$ which was calculated at the previous $\Phi_2$ clock phase, an inherent unit delay exists in the feedback path from $y_1(z)$ to the input A of integrator 40. This is represented by the $z^{-1}$ term before the $y_1(z)$ term in the above equation. Since an inherent delay exists in the feedback path from $y_1(z)$ to the input A of integrator 40, no explicit latch is required to perform this function.

The output $y_1(z)$, which is essentially $y_1b(z)$ that has been sampled during the $\Phi_2$, can be represented by the following equation:

$$y_1(z)=[(C_4/C_6)y_1a(z)-(C_5/C_6)z^{-\frac{1}{2}}y_1(z)]z^{-\frac{1}{2}}/(1-z^{-1})$$

There is an extra one-half sample delay in front of the $y_1(z)$ term in the above equation which is represented by the $z^{-\frac{1}{2}}$ term. This is because the actual value of $y_1(z)$ which is used is the value of $y_1(z)$ which existed during the $\Phi_1$ cycle prior to the $\Phi_2$ cycle during which the output $y_1b(z)$ is sampled.

Referring to the block diagram in FIG. 12, it can be seen that the desired equation for $y_1d_1(z)$ is as follows:

$$y_1d_1(z)=(1/K_1)[x(z)-z^{-1}y_2d_1(z)]z^{-\frac{1}{2}}(1-z^{-1})$$

One can see that the above equation is of the same form as the equation for $y_1a(z)$ given previously. In the above equation, the term $1/K_1$ is realized by the capacitor ratio $C_1/C_3$ as well as the ratio $C_2/C_3$ in FIG. 14.

Likewise, referring to FIG. 12, the desired equation for $y_2d_1(z)$ can be represented by the following equation:

$$y_2d_1(z)=[(K_1/K_2)y_1d(z)-(2/K_2)z^{-\frac{1}{2}}y_2d_1(z)]z^{-\frac{1}{2}}/(1-z^{-1})$$

This equation is of the same form given for the equation for $y_1(z)$, given previously. In this case, the ratio $K_1/K_2$ is realized by the capacitor ratio $C_4/C_6$ in FIG. 14. Likewise, the term $2/K_2$ would be realized by the capacitor ratio $C_5/C_6$. As explained previously in this disclosure, any effective scaling immediately before the quantizer will have no effect on the overall transfer function since a 1 bit quantizer only quantizes the sign of the signal at its input. Thus, the second-order sigma-delta modulator shown in FIG. 14, which includes integrator 40, integrator 41, and comparator 47, can be represented by the following equation:

$$y_1(z)=z^{-1}x(z)+E_1(z)(1-z^{-1})^2$$

In the above equation, $y_1(z)$ is the output of comparator 47, $x(z)$ is the sampled analog input to the sigma-delta modulator and $E_1(z)$ is the quantization noise due to comparator 47.

Using similar arguments as have been used in the foregoing discussion, appropriate equations for the second, second-order modulator shown in FIG. 14 which includes integrator 42, integrator 43, and comparator 49, can be developed. Thus, it can be seen that the two sigma-delta modulators which are shown in FIG. 14 are an appropriate practical embodiment of the two sigma-delta modulators shown in block diagram form in FIG. 10.

Figure 16:
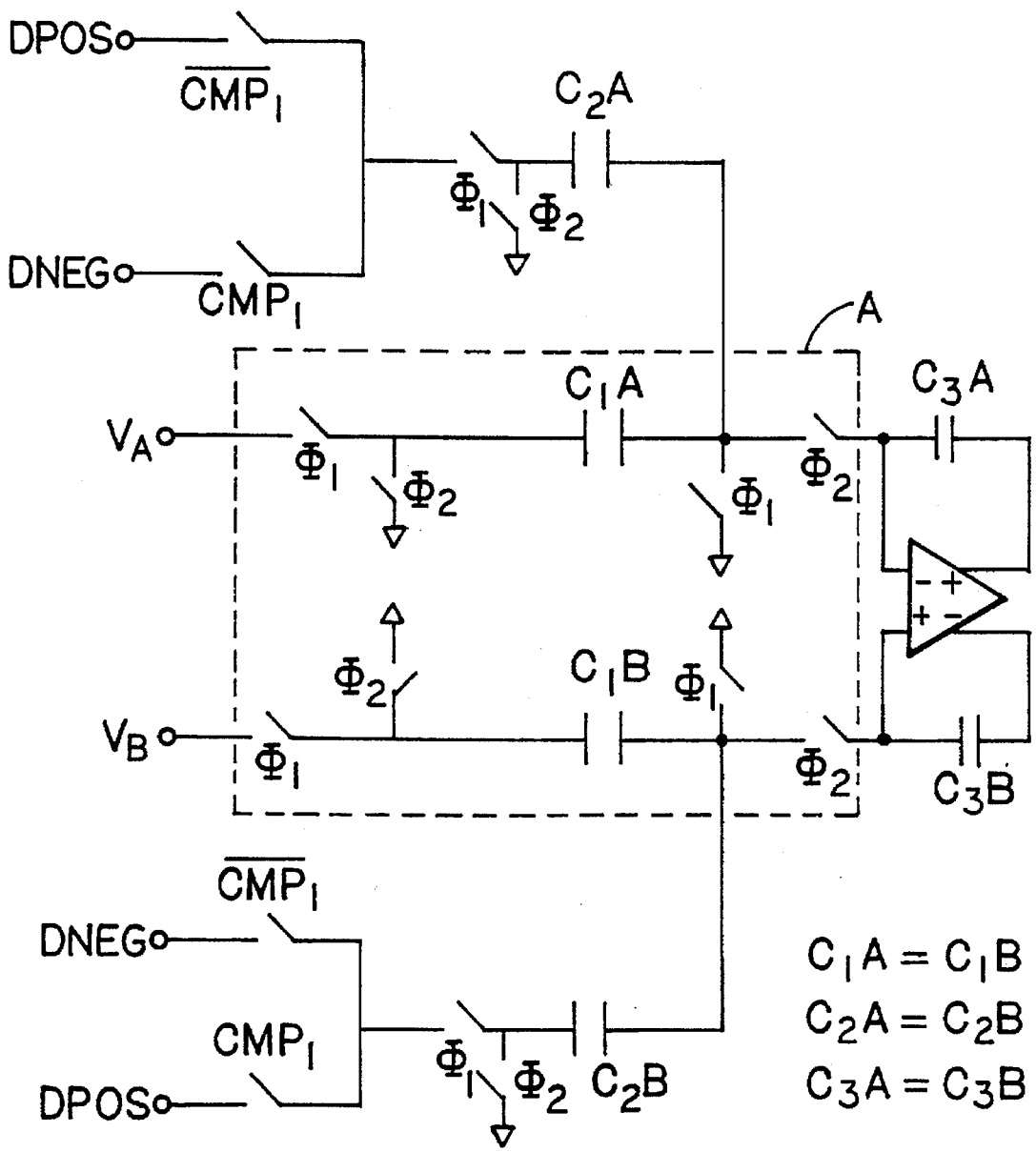
FIG. 16 shows an alternative embodiment of an integration stage of a sigma-delta modulator of the present invention.
Figure 17:
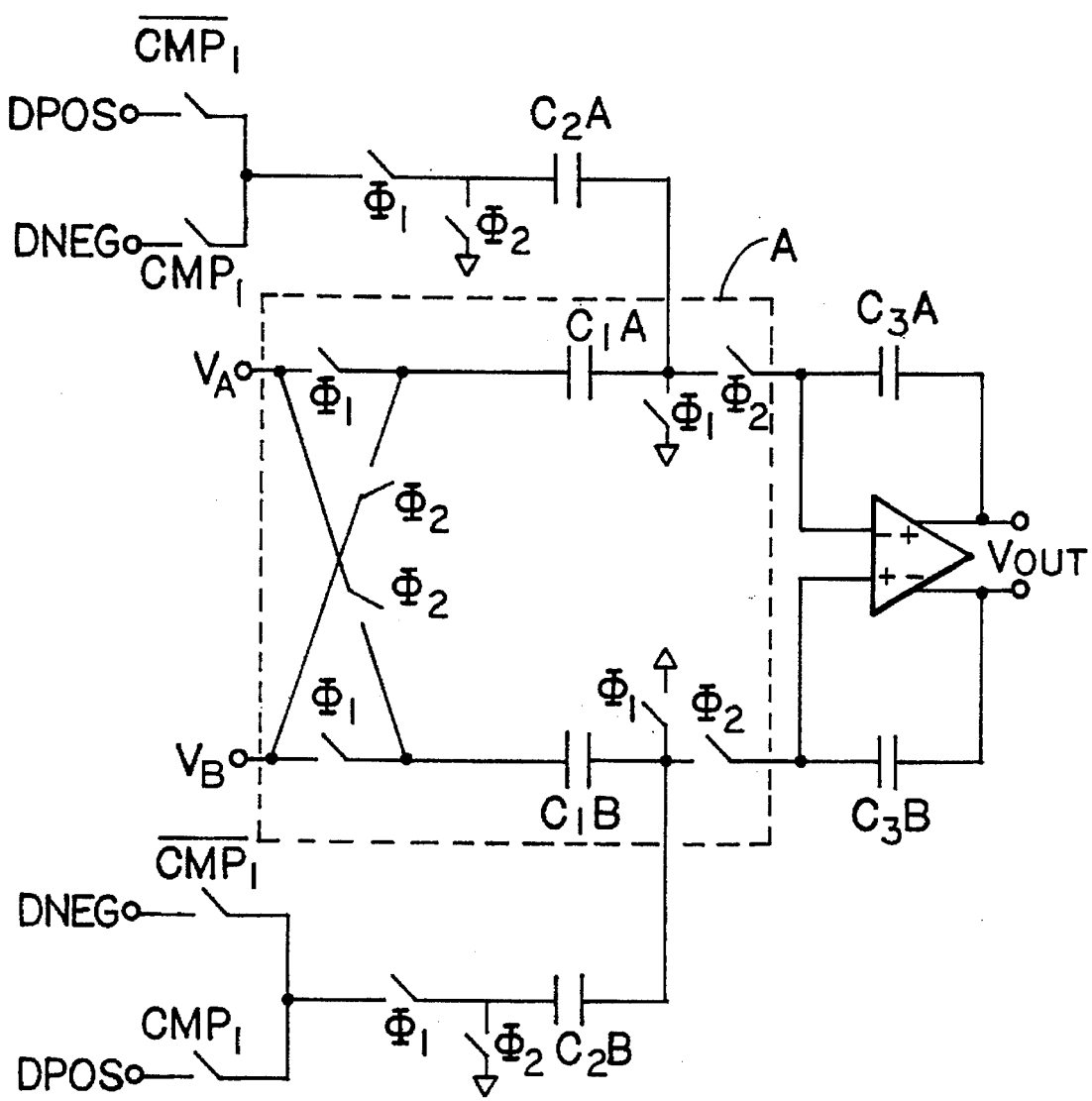
FIG. 17 illustrates an additional embodiment of an integration stage of a sigma-delta/modulator of the present invention.

A preferred method of implementing the analog portion of the architecture is to utilize fully differential design techniques. Examples of differential differencing integrators, which may replace the summing integrators 40–43 shown in FIG. 14, are shown in FIGS. 16 and 17. The timing shown in FIGS. 16 and 17 is preferred where the differential differencing integrators shown therein replace summing integrators 40 and 42 in FIG. 14. When the integrators of FIGS. 16 and 17 are substituted for integrators 41 and 43 in FIG. 14, the clocks $\Phi_1$ and $\Phi_2$ shown within hashed area A of FIGS. 16 and 17 are reversed (i.e., $\Phi_1$ clocks become $\Phi_2$ and vice versa).

Other integrators have been described in the literature, including correlated-double-sampled and chopper stabilized integrators. These techniques may also be used to implement the aforementioned integrators. Three-phase clocking may also be employed which would allow both the input signal and the DPOS/DNEG signals to be double-sampled.

Figure 18:
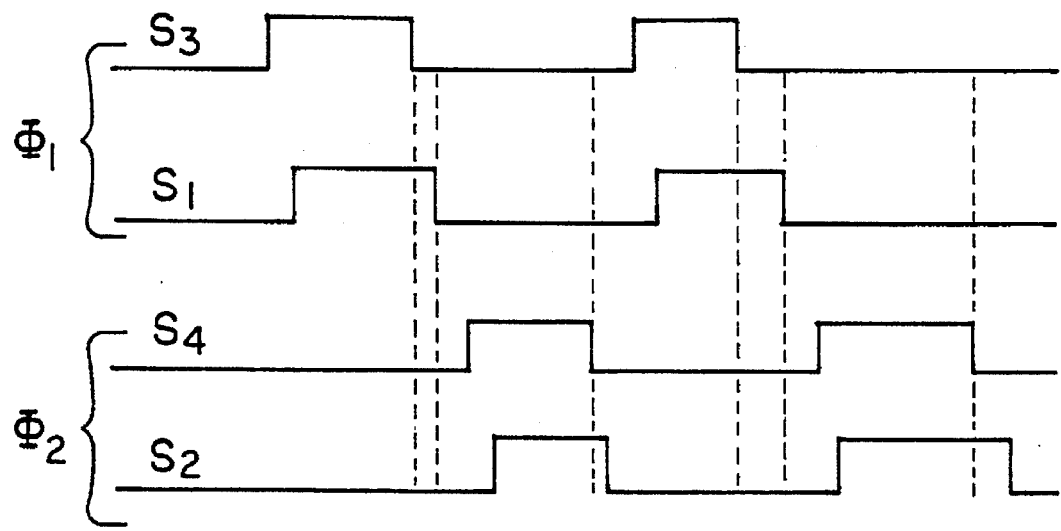
FIG. 18 is a timing diagram showing the timing of the switches in the sigma-delta embodiment illustrated in FIG. 19.

To reduce signal dependent charge injection and its accompanying harmonic distortion, clock phases $\Phi_1$ and $\Phi_2$ can be implemented as four clocks, as shown in FIG. 18. This technique is described by Kuang-Lu Lee and Robert G. Meyer, *IEEE JSSC*, December 1985, Vol. SC-20, No. 6, pp. 1103–1113, entitled, Low-Distortion Switched Capacitor Filter Design Techniques, incorporated herein for all purposes.

Figure 19:
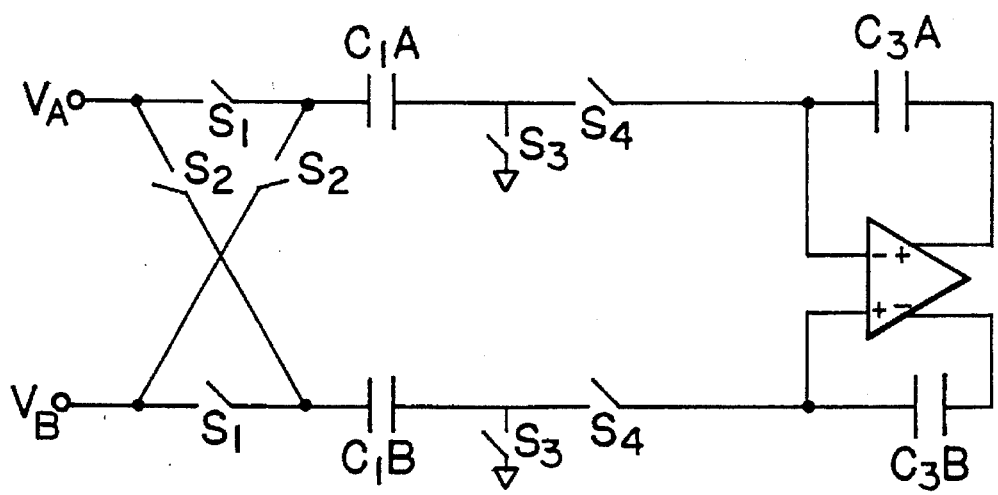
FIG. 19 is an embodiment of an integration stage of a sigma-delta modulator of the present invention.

As shown in FIG. 19, utilizing the four clock technique of FIG. 18, switches controlled by $S_3$ open slightly before switches controlled by $S_1$ and switches controlled by $S_4$ open slightly before switches controlled by $S_2$. When switches controlled by $S_3$ open, charge is injected onto capacitors $C_1A$ and $C_1B$. Since switches controlled by $S_3$ previously connected one plate of $C_1A$ and one plate of $C_1B$ to a reference point, the charge that is injected due to switches controlled by $S_1$ opening is not input signal dependent. When switches controlled by $S_1$ open, capacitors $C_1A$ and $C_1B$ already have one plate floating. Thus, the action of switches controlled by $S_1$ cannot inject charge onto $C_1A$ or $C_1B$. Likewise, since before opening, switches controlled by $S_4$ were previously connected to a virtual ground node, no input signal dependent charge is injected onto capacitors $C_1A$, $C_1B$, $C_3A$, or $C_3B$. When switches controlled by $S_2$ open, capacitors $C_1A$ and $C_1B$ already have one plate floating. Thus, the action of opening switches controlled by $S_2$ cannot inject charge onto capacitors $C_1A$ and $C_1B$.

Figure 20:
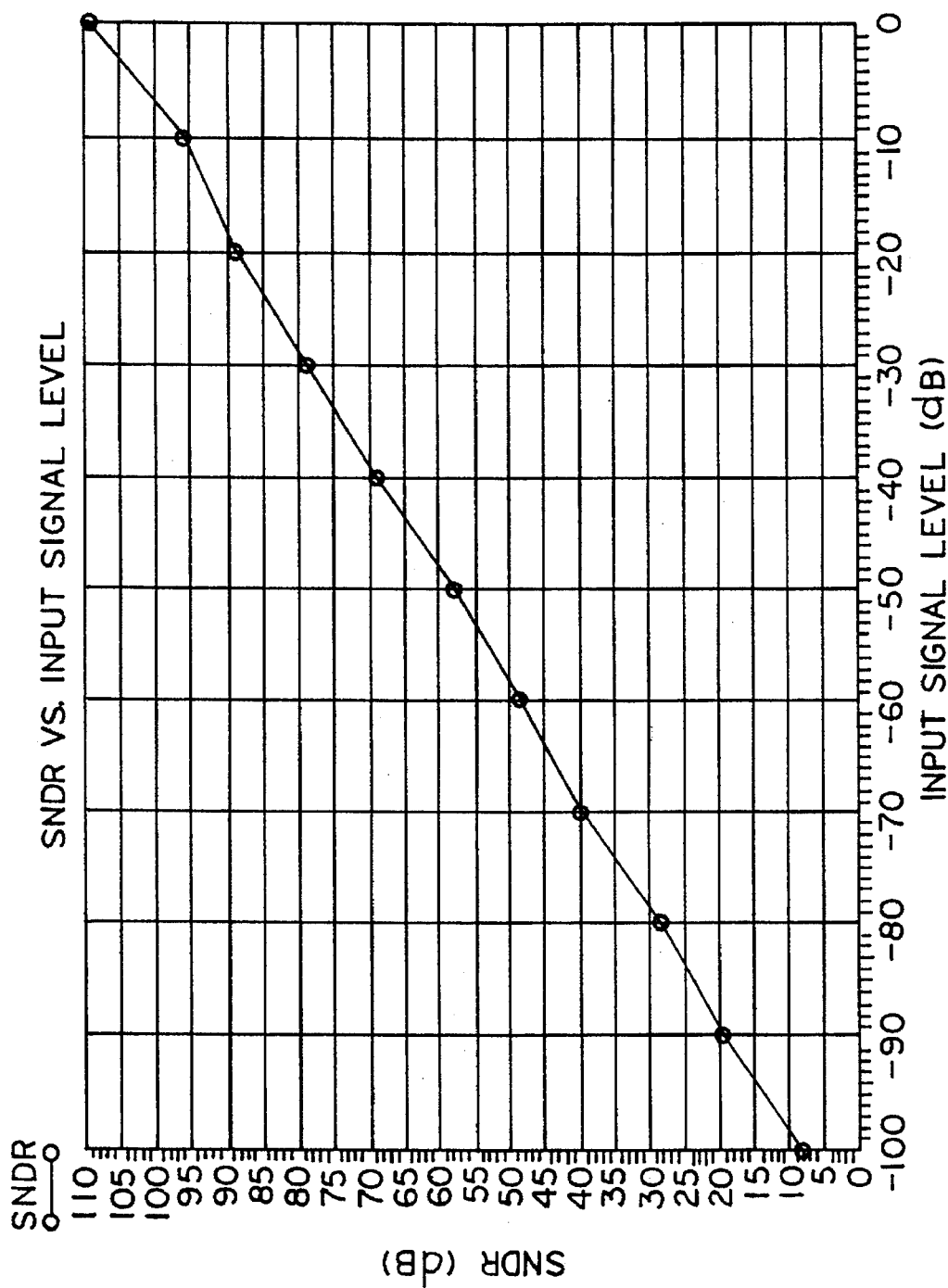
FIG. 20 is a graphic illustration of a plot of simulated signal noise plus distortion ratio levels (SNDR), with an oversampling ratio of 64, of a sigma-delta modulator of the present invention.

FIG. 20 graphically illustrates the plot of simulated signal to noise plus distortion ratio levels (SNDR) for $K_1=4$, $K_2=8$, $K_3=4$, and $K_4=8$ with an oversampling ratio of 64. Zero dB is defined as a full-scale input voltage which is one-half the D/A converter reference voltage, which for a differential implementation of FIGS. 16 and 17 would be the voltage defined by DPOS-DNEG.

Figure 21:
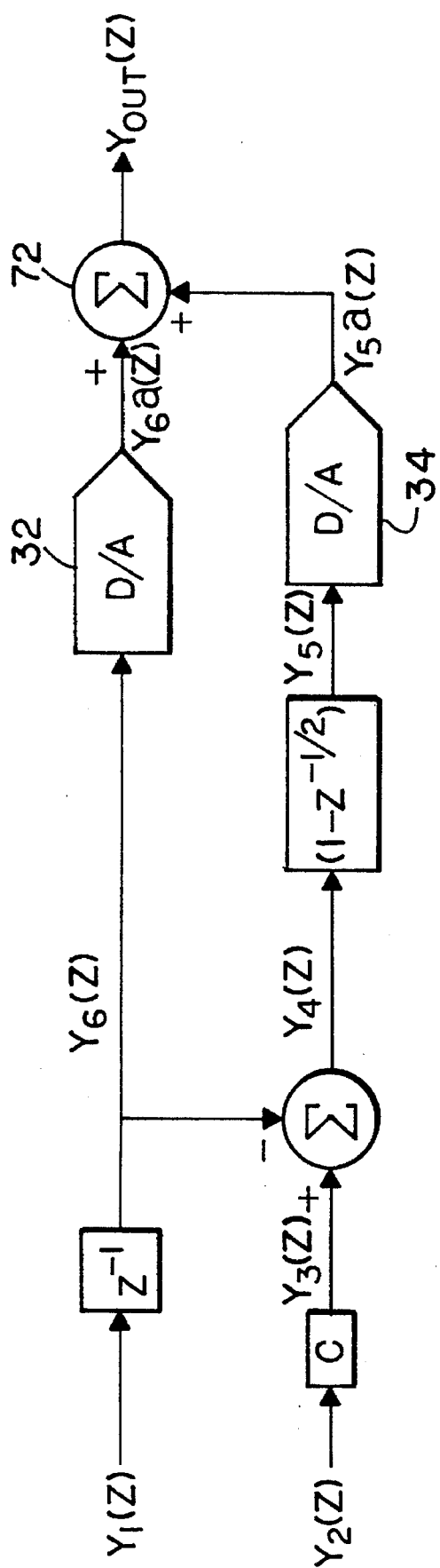
FIG. 21 is a post-quantization network for a D/A modulator of the present invention.

In another embodiment, the invention disclosed herein may be used as a digital noise shaper for a D/A converter implementation. In that case, the two second-order sigma-delta modulators which are connected together in FIG. 10 would be implemented as digital circuitry comprised of appropriate adders, subtractors, accumulators, multipliers, and quantizers. The post-quantizer circuitry shown in FIG. 11 would be modified as shown in FIG. 21. Digital signal $y_6(z)$ would be converted to an analog signal by D/A converter 32. Likewise, digital signal $y_5(z)$ would be converted to an analog signal by D/A converter 34. The resultant signals, $y_6a(z)$ and $y_5a(z)$, respectively would then be summed together by an analog summing node 72. There are numerous methods by which two analog signals may be summed together which are well known by those skilled in the art. Likewise, there are numerous methods which are known by those skilled in the art by which a digital signal may be converted to an analog signal. Any such method would be appropriate for D/A converters 32 and 34 in FIG. 21.

If the quantizer $Q_1$ in the second-order sigma-delta modulator 11 shown in FIG. 10 quantizes only the sign of the signal input to it, signal $y_1(z)$, and thus signal $y_6(z)$, of FIG. 21 would be represented by a 1-bit digital signal. A D/A converter which converts a 1-bit digital signal to an analog signal would result in an analog signal with only two output voltage, or current levels, possible. Such a D/A converter would be inherently linear and thus would contribute no distortion terms to the final analog signal, $y_{out}(2)$. If the quantizer $Q_2$ in the second-order sigma-delta modulator 13 shown in FIG. 10 likewise quantizes only the sign of the signal input to it, then signal $y_2(z)$ would be represented by a 1-bit digital signal. After being processed according to the aforementioned equations as illustrated in the block diagram shown in FIG. 21, it is clear that signal $y_5(z)$ would be represented by a plurality of bits for any value of C greater than one. Thus, the D/A converter 34 would convert a signal represented by a plurality of bits to an analog signal would have a plurality of possible output voltages, or currents, which correspond to any possible code represented by $y_5(z)$.

As stated previously herein, signal $y_5(z)$ can be represented by the following equation:

$$y_5(z) = -z^{-1}(1-z^{-1})^2 E_1(z) + C(1-z^{-1})^4 E_2(z)$$

As shown in the above equation, $y_5(z)$ contains no terms which represent the input signal, $x(z)$. Thus, the D/A converter 34 in FIG. 21 will add no terms which would cause harmonic distortion in the final output signal $y_{out}$ if there are any nonidealities in the D/A converter 34. If D/A converter 34 is nonideal, signal $y_5a(z)$ may be represented by the following equation:

$$y_5a(z) = R[-z^{-1}(1-z^{-1})^2 E_1(z) + C(1-z^{-1})^4 E_2(z)]$$

In the above equation, R is a term which represents any nonidealities, or nonlinearities, in D/A converter 34 in FIG. 21. If D/A converter 32 in FIG. 21 is ideal, then the following equation would represent $y_6a(z)$:

$$y_6a(z) = z^{-2}x(z) + z^{-1}E_1(z)(1-z^{-1})^2$$

The final output signal, $y_{out}(z)$ would then be the sum of $y_5a(z)$ and $y_6a(z)$ and would be represented by the following equation:

$$y_{out}(z) = z^{-2}x(z) + E_1(z)z^{-1}(1-z^{-1})^2(1-R) + RCE_2(z)(1-z^{-1})^4$$

It can be seen by the above equation that if D/A converter 34 of FIG. 21 is not perfect, then the quantization noise of the first, second-order sigma-delta modulator would not be perfectly canceled and thus, some quantization noise $E_1(z)$ would be present in the final output, $y_{out}(z)$. Also, the quantization noise $E_2(z)$ would be modified slightly. Thus, it can be seen that while additional noise may be introduced due to nonidealities, additional harmonic distortion will not be produced.

The foregoing disclosure and description of the invention are illustrative and explanatory of the preferred embodiments, and changes in the individual components, elements or connections may be made without departing from the spirit of the invention and the scope of the following claims.

What is claimed is:

1. A post-quantization network for a fourth-order sigma-delta modulator for an A/D converter, comprising;

a first digital input, output from a first second-order sigma-delta modulator;

a second digital input, output from a second second-order sigma-delta modulator; and a digital output;

wherein said first digital input is connected to an input of a delay block and said second input in multiplied by a constant;

wherein an output of said delay block is connected to a first input of a first summing node and to a first input of a second summing node;

wherein said multiplied second input is connected to a second input of said first summing node;

wherein an output of said differentiator is provided to a second input of said second summing node; and wherein said digital output is provided by an output of said second summing node.

2. A fourth-order sigma delta modulator for an A/D converter, comprising:

an analog input signal;

a first digital output signal;

a first summing node, including a first output of said first summing node connected to said analog input signal;

a second input of said first summing node connected to a first unit delay feedback block, and an output of said first summing node connected to an input of a first integrator, wherein said first integrator includes a one-half unit delay associated therewith;

a second summing node, including a first input of said one-half unit delay first integrator, a second input of said second summing node connected to an output of a first one-half unit delay feedback block, and an output of said second summing node connected to an input of a second integrator, wherein said second integrator includes a one-half unit delay associated therewith;

a first quantizer, including a first quantizer input connected to an output of said one-half unit delay second integrator, and a first quantizer output connected to: an input of said first one-half unit delay feedback block, to an input of said first unit delay feedback block and to said first digital output signal;

a second digital output signal;

a third summing node, including a first input of said third summing node connected to said first quantizer input;

a second input of said third summing node connected to a second unit delay feedback block, and an output of said third summing node connected to an input of a third integrator, wherein said third integrator includes a one-half unit delay associated therewith;

a fourth summing node, including a first input of said fourth summing node connected to an output of said one-half unit delay third integrator, a second input of said fourth summing node connected to an output of a second one-half unit delay feedback block, and an output of said fourth summing node connected to an input of a fourth integrator, wherein said fourth integrator includes a one-half unit delay associated therewith;

a second quantizer, including a second quantizer input connected to an output of said one-half unit delay fourth integrator, and a second quantizer output connected to: an input of said second one-half unit delay feedback block, to an input of said second unit delay feedback block and to said second digital output signal;

a first post-quantization network input, output from said first quantizer output;

a second post-quantization network input, output from said second quantizer output; and a post-quantization network digital output;

wherein said first network input is connected to an input of a network delay block and said second network input is multiplied by constant;

wherein an output of said network delay block is connected to a first input of a first network summing node and to a first input of a second network summing node;

wherein said multiplied second network input is connected to a second input of said first network summing node;

wherein an output of said second network summing node is provided to an input of a differentiator;

wherein an output of said differentiator is provided to a second input of said second network summing node; and wherein said network digital output is connected to an output of said second summing network node.

3. A post-quantization network for a fourth-order sigma-delta modulator for a D/A converter, comprising:

a first digital input, output from a first second-order sigma-delta modulator;

a second digital input, output from a second second-order sigma delta modulator; and an analog output;

wherein said first digital input is connected to an input of a delay block;

wherein said second digital input is multiplied by a constant and is then provided to a first input of a first summing node;

wherein an output of said delay block is provided to a second input of said first summing node and to an input of a first D/A converter;

wherein an output of said first summing node is connected to an input of a differentiator;

wherein an output of said differentiator is input to a second D/A converter;

wherein an output of said first differentiator is input to a second D/A converter;

wherein an output of said first D/A converter is provided to a first input of a second summing node and an output of said second D/A converter is provided to a second input of said second summing node; and wherein said analog output is connected to an output of said second summing node.

4. The network of claim 3, wherein said first D/A converter is a one-bit D/A converter.

5. The network of claim 3, wherein said second D/A converter is a multi-bit D/A converter.

6. A fourth-order sigma-delta modulator system for a D/A converter, comprising:

a digital input signal;

an analog output signal;

a first summing node, including a first input connected to said digital input signal, a second input of said first summing node connected to a first unit delay feedback block, and an output of said first summing node connected to an input of a first integrator, wherein said first integrator includes a one-half unit delay associated therewith;

a second summing node, including a first input of said second summing node connected to an output of said one-half unit delay first integrator, a second input of said second summing node connected to an output of a first one-half unit delay feedback block, and an output of said second summing node connected to an input of a second integrator, wherein said second integrator includes a one-half unit delay associated therewith;

a first quantizer, including a first quantizer input connected to an output of said one-half unit delay second integrator, and a first quantizer output connected to: an input of said first one-half unit delay feedback block, to an input of said first unit delay feedback block and to a first digital output signal;

a second digital output signal;

a third summing node, including a first input of said third summing node connected to said first quantizer input;

a second input of said third summing node connected to a second unit delay feedback block, and an output of said third summing node connected to an input of a third integrator, wherein said third integrator includes a one-half unit delay associated therewith;

a fourth summing node, including a first input of said fourth summing node connected to an output of said one-half unit delay third integrator, a second input of said fourth summing node connected to an output of a second one-half unit delay feedback block, and an output of said fourth summing node connected to an input of a fourth integrator, wherein said fourth integrator includes a one-half unit delay associated therewith;

a second quantizer, including a second quantizer input connected to an output of said one-half unit delay fourth integrator, and a second quantizer output connected to: an input of said second one-half unit delay feedback block, to an input of said second unit delay feedback block and to said second digital output signal;

a first post-quantization digital input, output from said first quantizer;

a second post-quantization digital input, output from said second quantizer;

wherein said first post-quantization digital input is connected to an input of a post-quantization delay block;

wherein said second post-quantization digital input is multiplied by a constant and is then provided to a first input of a first post-quantization summing node;

wherein an output of said post-quantization delay block is provided to a second input of said first post-quantization summing node and to an input of a first post-quantization D/A converter;

wherein an output of said first post-quantization summing node is connected to an input of a differentiator;

wherein an output of said differentiator is input to a second post-quantization D/A converter;

wherein an output of said post-quantization first D/A converter is provided to a first input of a second post-quantization summing node and an output of said second post-quantization D/A converter is provided to a second input of said second summing node; and wherein said analog output signal is provided at an output of said second post-quantization summing node.

7. A fourth-order sigma-delta modulator system comprising:

a first second-order sigma-delta modulator having an input and an output;

a second second-order sigma-delta modulator having an input and an output;

a post-quantization network having a first network input connected to said output of said first modulator and a second network input connected to said output of said second modulator; and wherein said first and second modulators each include a first and a second integration stage, wherein each said integration stage includes an integrator having a ½ unit delay associated therewith.

8. The fourth-order modulator system of claim 7, wherein said first modulator further comprises a first modulator quantizer, said first modulator quantizer being connected to an output of said second integration stage in said first modulator, and wherein an output of said first modulator quantizer is connected to said output of said first modulator.

9. The fourth-order modulator system of claim 8, wherein said second modulator further comprises a second modulator quantizer, said second modulator quantizer being connected to an output of said second integration stage in said second modulator, and wherein an output of said second modulator-quantizer is connected to said output of said second modulator.

10. The fourth-order modulation system of claim 9, wherein a feedback path having a ½ unit delay associated therewith connects between said second modulator output and an input to said second integration stage in said second modulator, wherein a second feedback path, having a unit delay associated therewith, connects between said second modulator output and an input to said first integration stage in said second modulator.

11. The fourth-order modulator system of claim 8, wherein a feedback path having a ½ unit delay associated therewith connects between said first modulator output and an input to said second integration stage in said first modulator, wherein a second feedback path, having a unit delay associated therewith, connects between said first modulator output and an input to said first integration stage in said first modulator.

* * * * *